(12) United States Patent
Emadi et al.

(10) Patent No.: US 12,062,674 B2
(45) Date of Patent: Aug. 13, 2024

(54) SENSORS HAVING AN ACTIVE SURFACE

(71) Applicant: Illumina, Inc., San Diego, CA (US)

(72) Inventors: Arvin Emadi, Hayward, CA (US);
Arnaud Rival, Saint Nazaire les Eymes (FR); Ali Agah, Menlo Park, CA (US)

(73) Assignee: Illumina, Inc., San Diego, CA (US)

( * ) Notice: Subject to any disclaimer, the term of this patent is extended or adjusted under 35 U.S.C. 154(b) by 0 days.

(21) Appl. No.: 17/804,023

(22) Filed: May 25, 2022

(65) Prior Publication Data

US 2022/0367547 A1 Nov. 17, 2022

Related U.S. Application Data

(62) Division of application No. 15/929,760, filed on May 20, 2020, now Pat. No. 11,387,269.

(Continued)

(51) Int. Cl.
*H01L 27/146* (2006.01)
*H01L 23/00* (2006.01)

(52) U.S. Cl.
CPC ........ *H01L 27/14618* (2013.01); *H01L 24/05* (2013.01); *H01L 27/14636* (2013.01);
(Continued)

(58) Field of Classification Search
CPC ............... H01L 27/14618; H01L 24/05; H01L 27/14636; H01L 27/14643; H01L 27/14689; H01L 27/14698; H01L 24/02; H01L 24/16; H01L 24/24; H01L 24/48; H01L 2224/02372; H01L 2224/05008; H01L 2224/13024; H01L 2224/16235; H01L 2224/24105; H01L 2224/24226; H01L 2224/245; H01L 2224/2499; H01L 2224/25175; H01L 2224/29099; H01L 2224/2929; H01L 2224/29299; H01L 2224/32225; H01L 2224/45124; H01L 2224/45139; H01L 2224/45144;
(Continued)

(56) References Cited

U.S. PATENT DOCUMENTS 8,536,672 B2  9/2013 Chang et al.
8,906,320 B1 * 12/2014 Eltoukhy ........... G01N 21/6486
                                                        422/417

(Continued)

FOREIGN PATENT DOCUMENTS

JP  2016-008823     1/2016
KR  20100072533 A   7/2010
(Continued)

*Primary Examiner* — Jonathan Han
(74) *Attorney, Agent, or Firm* — Heslin Rothenberg Farley & Mesiti PC; Rachel L. Pearlman, Esq.

(57) ABSTRACT

Disclosed in one example is an apparatus including a substrate, a sensor over the substrate including an active surface and a sensor bond pad, a molding layer over the substrate and covering sides of the sensor, the molding layer having a molding height relative to a top surface of the substrate that is greater than a height of the active surface of the sensor relative to the top surface of the substrate, and a lidding layer over the molding layer and over the active surface. The lidding layer and the molding layer form a space over the active surface of the sensor that defines a flow channel.

20 Claims, 17 Drawing Sheets

Related U.S. Application Data

(60) Provisional application No. 62/850,894, filed on May 21, 2019.

(52) U.S. Cl.
CPC .. *H01L 27/14643* (2013.01); *H01L 27/14689* (2013.01); *H01L 27/14698* (2013.01)

(58) Field of Classification Search
CPC . H01L 2224/45147; H01L 2224/48227; H01L 2224/48235; H01L 2224/49175; H01L 2224/73265; H01L 2224/81903; H01L 2224/8203; H01L 2224/82051; H01L 2224/85805; H01L 2224/95; H01L 2924/00011; H01L 27/14683; H01L 27/14601; H01L 2224/83; H01L 2224/85; H01L 2924/00014; H01L 2224/82; H01L 2924/00; H01L 2924/013; H01L 2924/01028; H01L 2924/01074; H01L 2924/01079; H01L 2924/01029; H01L 2924/01049; B01L 3/502707; B01L 2300/0636; B01L 2300/0663; B01L 2300/0877; B01L 2300/0896; G01N 21/05; G01N 21/6454; G01N 21/03; G01N 21/27; G01N 21/6428; G01N 21/75; G01N 2021/0325; G01N 15/00; G01N 21/645; G01N 21/6458; G01N 21/6486

See application file for complete search history.

(56) References Cited

U.S. PATENT DOCUMENTS

| | | | |
|---|---|---|---|
| 9,079,179 B2* | 7/2015 | Wimberger-Friedl | ....................... B01L 3/50273 |
| 9,387,476 B2* | 7/2016 | Eltoukhy | .......... B01L 3/502715 |
| 9,670,445 B1* | 6/2017 | Kuo | ........................ G01N 29/00 |
| 2004/0043423 A1* | 3/2004 | Bellew | ................. G01N 29/223 435/7.1 |
| 2005/0155411 A1 | 7/2005 | Rogalla et al. | |
| 2006/0010964 A1 | 1/2006 | Sparks et al. | |
| 2007/0122314 A1 | 5/2007 | Strand et al. | |
| 2014/0077315 A1* | 3/2014 | Bischopink | ....... B01L 3/502707 438/49 |
| 2019/0070606 A1 | 3/2019 | Li et al. | |

FOREIGN PATENT DOCUMENTS

| | | |
|---|---|---|
| WO | 2018026830 A1 | 2/2018 |
| WO | 2019125689 | 6/2019 |
| WO | 2019152425 | 8/2019 |

\* cited by examiner

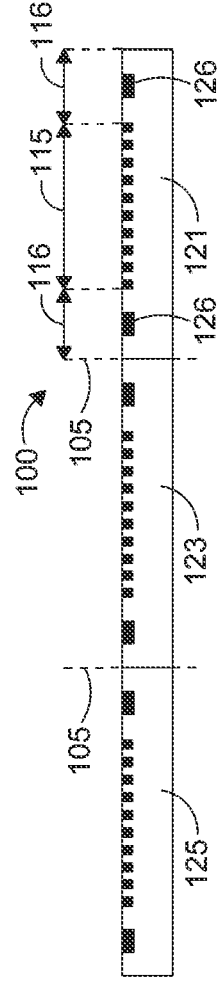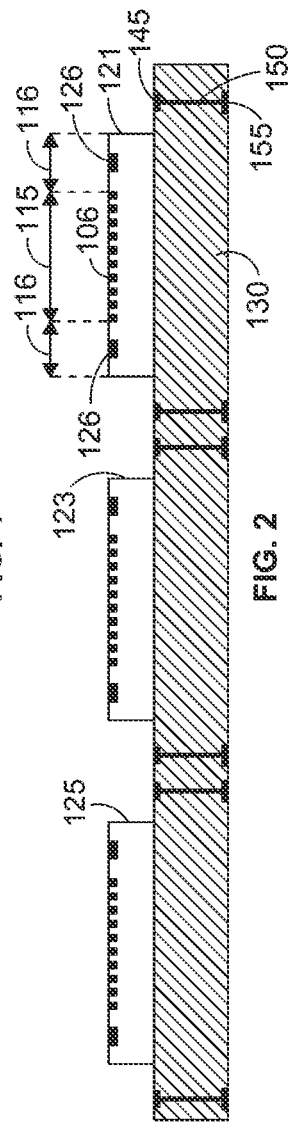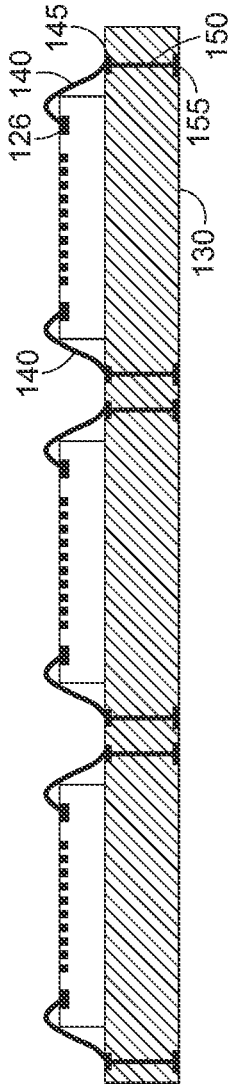

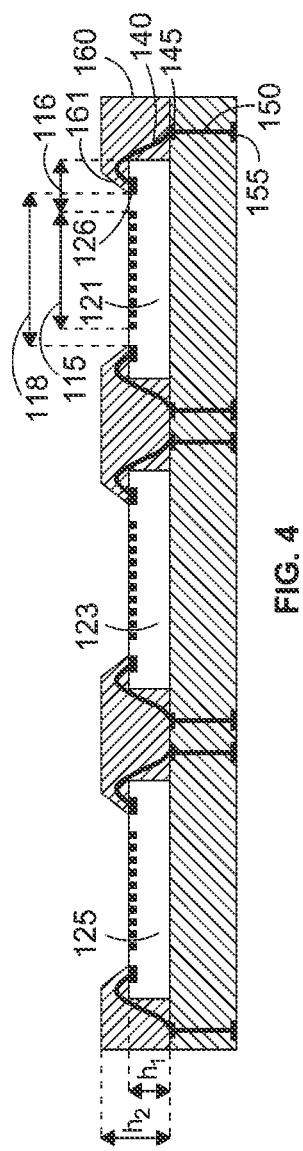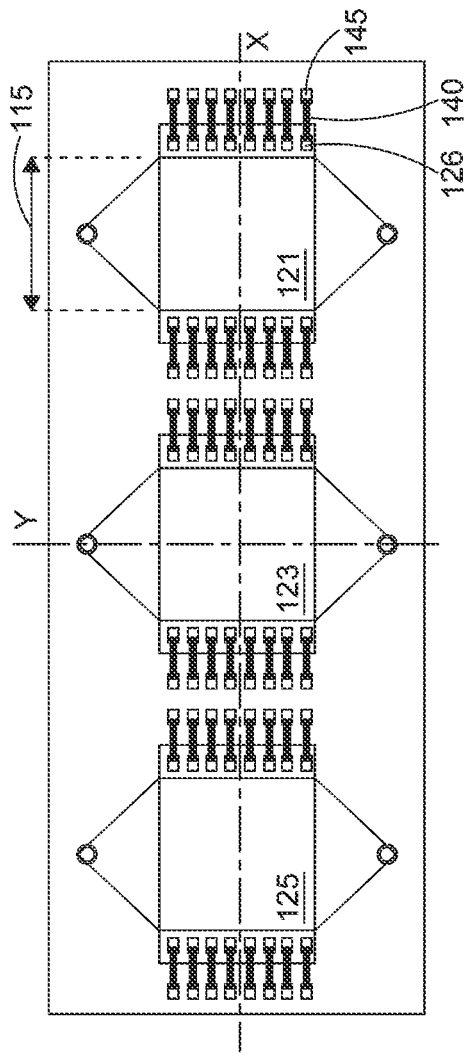

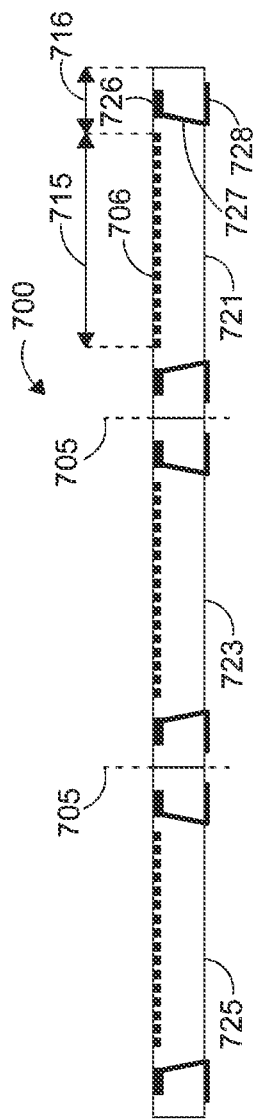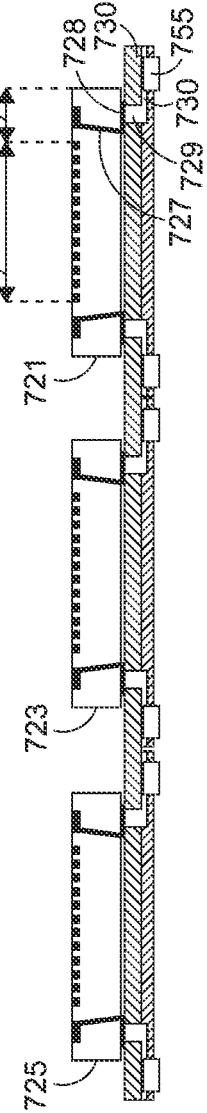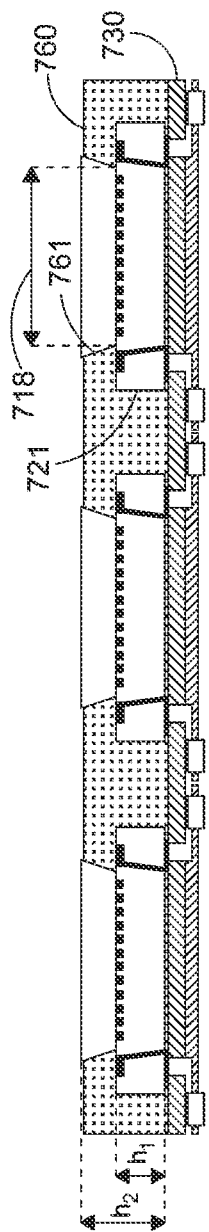
FIG. 7
FIG. 8
FIG. 9

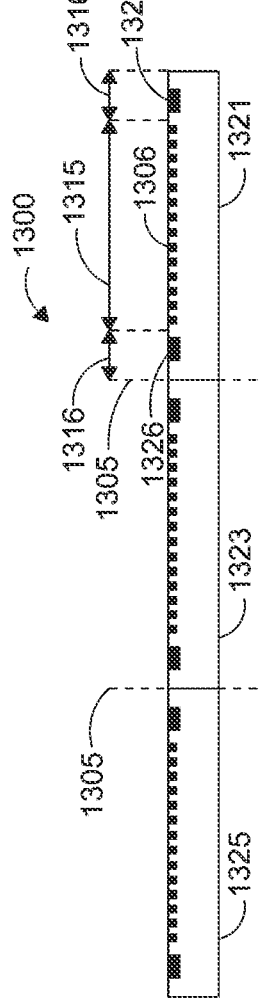
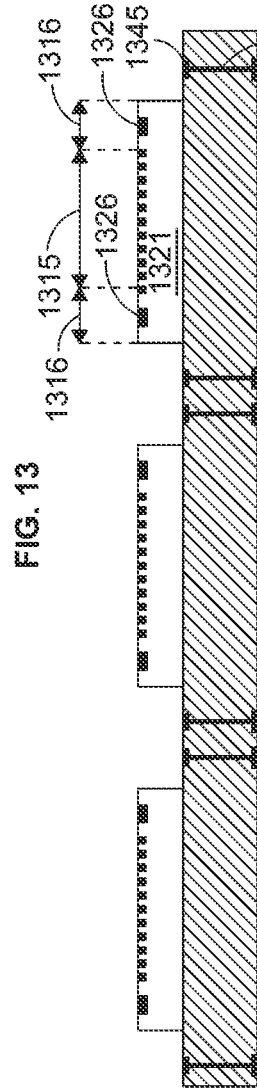
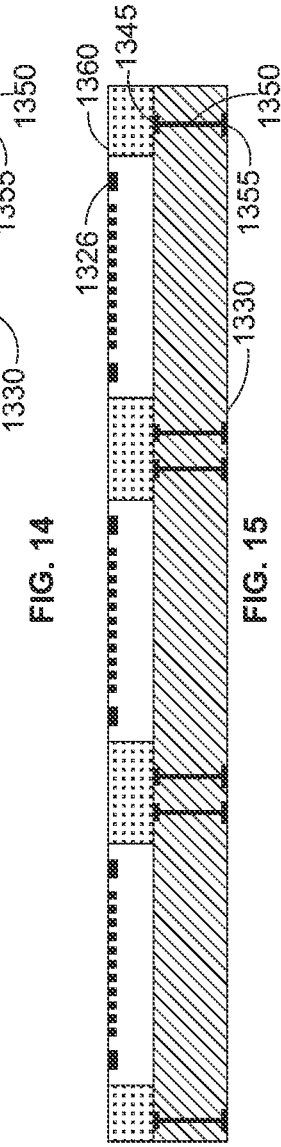

SENSORS HAVING AN ACTIVE SURFACE

CROSS REFERENCE TO RELATED APPLICATIONS

This application is a divisional of U.S. patent application Ser. No. 15/929,760 filed May 20, 2020, entitled "SENSORS HAVING AND ACTIVE SURFACE", which claims priority to U.S. Provisional Patent Application No. 62/850,894, filed May 21, 2019, entitled "SENSORS HAVING AN ACTIVE SURFACE", the entire contents of both which are hereby incorporated herein by reference in their entirety for all purposes.

BACKGROUND

Various protocols in biological or chemical research involve performing a large number of controlled reactions on local support surfaces or within predefined reaction chambers. The designated reactions may then be observed or detected, and subsequent analysis may help identify or reveal properties of substances involved in the reaction. For example, in some multiplex assays, an unknown analyte having an identifiable label (e.g., fluorescent label) may be exposed to thousands of known probes under controlled conditions. Each known probe may be deposited into a corresponding well of a microplate. Observing any chemical reactions that occur between the known probes and the unknown analyte within the wells may help identify or reveal properties of the analyte. Other examples of such protocols include known DNA sequencing processes, such as sequencing-by-synthesis (SBS) or cyclic-array sequencing.

In some pre-existing fluorescent-detection protocols, an optical system is used to direct an excitation light onto fluorescently-labeled analytes and to also detect the fluorescent signals that may be emitted from the analytes. However, such optical systems can be relatively expensive and involve a relatively large benchtop footprint. For example, such optical systems may include an arrangement of lenses, filters, and light sources. In other pre-existing detection systems, the controlled reactions occur on local support surfaces or within predefined reaction chambers of a flow cell that does not require a large optical assembly to detect the fluorescent emissions. The flow cells of such systems may be designed as a single use consumable item.

SUMMARY

Accordingly, it may be beneficial for the flow cell to be a small and inexpensive device. In a relatively small flow cell, it may be beneficial to utilize as much of the sensor active area of the light detection device as possible and/or provide as large as a sensor active area as possible. The shortcomings of pre-existing approaches may be overcome and additional advantages are provided through the examples provided herein.

In one aspect, an apparatus is provided. The apparatus comprises a substrate, a sensor over the substrate, the sensor comprising a sensor having an active surface, a molding layer, the molding layer over the substrate and the sides of the sensor, the molding layer having a molding height relative to a top surface of the substrate that is greater than a sensor surface height relative to the top surface of the substrate. The apparatus also includes a lidding layer over the molding layer and over the active surface of the sensor. The active surface of the sensor, the lidding layer and the molding layer form a space over the active surface of the sensor that defines a flow channel.

In some examples, the molding layer covers a wire bond that connects the sensor bond pad to the substrate bond pad.

In some examples, a through-silicon via (TSV) extends through the sensor and electrically connects the sensor bond pad to a sensor redistribution layer (RDL) on a bottom surface of the sensor, the sensor RDL in electrical contact with the substrate bond pad.

In some examples, the molding layer includes a first and second molding layer, the first molding layer includes a through-mold via (TMV) to a substrate bond pad, a redistribution layer (RDL) on a top surface of the sensor electrically connects the sensor bond pad to the TMV, and a second molding layer is over the RDL and first molding layer.

In some examples, a passivation layer is over the active surface of the sensor. In some such examples, a functionalized coating is over the passivation layer.

In some examples, the flow channel encompasses substantially all of the active surface of the sensor.

In some examples, the flow channel encompasses the entire active surface of the sensor and a portion of an inactive surface of the sensor.

In some examples, the flow channel encompasses a horizontal surface of the molding layer.

In some examples, the lidding layer comprises an inlet port and an outlet port.

In some examples, a surface of the molding layer separates the inlet port from the active surface of the sensor within the flow channel.

In some examples, the substrate comprises one or more dielectric layers, each of the one or more dielectric layers comprising one or more conductive pathways therein.

In some examples, wherein the sensor comprises a Complementary Metal-Oxide-Semiconductor (CMOS) detection device.

In some examples, the apparatus is part of a cartridge for at least one of biological analysis or chemical analysis.

In accordance with another aspect, an apparatus is provided. The apparatus comprises a sensor over the substrate, the sensor comprising a sensor having an active surface, and a sensor bond pad, a through-silicon via (TSV) extending through the sensor and electrically connecting the sensor bond pad to a redistribution layer (RDL) on a bottom surface of the sensor, the RDL in electrical contact with the substrate bond pad, a molding layer over the substrate covering the sides the sensor, the molding layer having a molding height relative to a top surface of the substrate, the molding height being substantially equal to the height of the active surface of the sensor relative to the top surface of the substrate. The apparatus also includes an interposer layer over the molding layer, a through-silicon via (TSV) in electrical contact with the substrate bond pad, the TSV extending through the substrate. A lidding layer is over the interposer layer and over the active surface, wherein the active surface of the sensor, the lidding layer and the interposer layer form a space over the active surface of the sensor, the space defining a flow channel.

In accordance with another aspect, a method is provided. The method comprises placing a sensor over a substrate, the sensor comprising a sensor having an active surface, forming a molding layer over the substrate, the molding layer comprising a molding height relative to a top surface of the substrate that is greater than a sensor active surface height relative to the top surface of the substrate, and placing a lidding layer on top surfaces of the molding layer, such that the lidding layer and the molding layer form a space over the active surface of the sensor to define a flow channel. In some examples, the method includes wire bonding the sensor bond pad to the substrate bond pad, wherein the molding layer covers the wire bonds.

In some examples, the method includes forming a through-silicon via (TSV) extending from the sensor bond pad through the sensor, forming a redistribution layer (RDL) on a bottom surface of the sensor, wherein the sensor bond pad is electrically connected to the RDL.

In other examples, the molding layer is a second molding layer, and the method further comprising forming a first molding layer to a height substantially equal to the height of the active surface of the sensor relative to the substrate, forming a through-mold via (TMV) through the first molding layer to the substrate bond pad, forming a redistribution layer (RDL) on a top surface of the sensor to electrically connect the sensor bond pad to the TMV, and forming a second molding layer over the RDL and first molding layer.

In some examples, the method further comprises forming an inlet port and an outlet port in the lidding layer.

In some examples, the method further comprises forming a passivation layer on the sensor surface. In some such examples, the method further comprises forming reaction recesses in the passivation layer. In some such examples, the method further comprises forming a functionalized coating on the passivation layer.

It should be appreciated that all combinations of the foregoing aspects and additional concepts discussed in greater detail below (provided such concepts are not mutually inconsistent) are contemplated as being part of the inventive subject matter disclosed herein.

These and other objects, features and advantages of this disclosure will become apparent from the following detailed description of the various aspects of the disclosure taken in conjunction with the accompanying drawings.

BRIEF DESCRIPTION OF THE DRAWINGS

These, and other objects, features and advantages of this disclosure will become apparent from the following detailed description of the various aspects thereof taken in conjunction with the accompanying drawings, in which:

FIGS. 1-5 are cross-sectional views of one example of various stages of fabricating an apparatus disclosed in the present disclosure.

FIG. 1 is a cross-sectional view of one example of dicing a sensor wafer having multiple sensors. The sensors include, for example, an active surface.

FIG. 2 is a cross-sectional view of one example of attaching the sensor dies of FIG. 1 onto a substrate, in accordance with one or more aspects of the present disclosure.

FIG. 3 is a cross-sectional view of one example of forming wire bonds from sensor bond pads to substrate bond pads of FIG. 2, in accordance with one or more aspects of the present disclosure.

FIG. 4 is a cross-sectional view of one example of forming a molding layer over the substrate of FIG. 3, in accordance with one or more aspects of the present disclosure.

FIG. 5A is a top view of the structure of FIG. 4, in accordance with one or more aspects of the present disclosure.

FIGS. 7-11 are cross-sectional views of one example of various stages of fabricating an apparatus disclosed in the present disclosure.

FIG. 7 is a cross-sectional view of one example of dicing a sensor wafer having multiple sensors. The sensors include, for example, a sensor with an active surface.

FIG. 8 is a cross-sectional view of one example of attaching the sensors of FIG. 7 onto a substrate, in accordance with one or more aspects of the present disclosure.

FIG. 9 is a cross-sectional view of one example of forming a molding layer over the substrate of FIG. 8, in accordance with one or more aspects of the present disclosure.

FIG. 11 is a cross-sectional view of one example of attaching a lidding layer over the molding layer and active surface of the sensor of FIG. 10B resulting in a space over the active surface of the sensors, in accordance with one or more aspects of the present disclosure.

FIGS. 13-18 are cross-sectional views of one example of various stages of fabricating an apparatus disclosed in the present disclosure.

FIG. 13 is a cross-sectional view of one example of dicing a sensor wafer having multiple sensors into individual sensors. The sensors include, for example, an active surface.

FIG. 14 is a cross-sectional view of one example of attaching the sensors of FIG. 13 onto a substrate, in accordance with one or more aspects of the present disclosure.

FIG. 15 is a cross-sectional view of one example of forming a first molding layer over the substrate of FIG. 14, in accordance with one or more aspects of the present disclosure.

FIG. 16 is a cross-sectional view of one example of forming a through-mold via (TMV) and top side re-distributional layer (RDL) over the sensor bond pads and first molding layer of FIG. 15, in accordance with one or more aspects of the present disclosure.

FIG. 17 is a cross-sectional view of one example of forming a second molding layer over the first molding layer of FIG. 16.

DETAILED DESCRIPTION

Figure 5B:
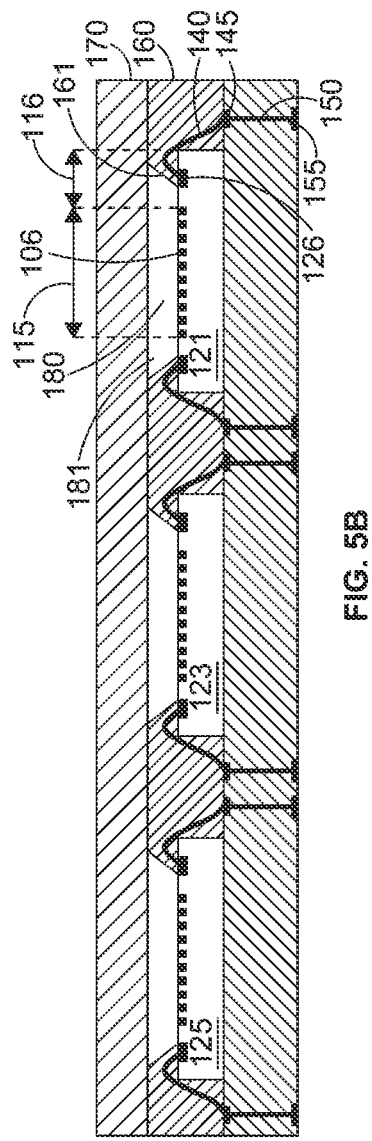
FIG. 5B is a cross-sectional view through dashed line "X" of FIG. 5A following lidding layer attachment, illustrating a fan-out structure in accordance with one or more aspects of the present disclosure.

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the relevant details. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that may permissibly vary without resulting in a change in the basic function to which it is related. Accordingly, a value or parameter modified by a term or terms, such as "about" or "substantially," is not limited to the precise value specified. For example, these terms can refer to less than, greater than, or equal to ±5% of the value or parameter, such as less than, greater than, or equal to ±2%, such as less than, greater than or equal to ±1%, such as less than, greater than, or equal to ±0.5%, such as less than, greater than, or equal to ±0.2%, such as less than, greater than, or equal to ±0.1%, such as less than, greater than, or equal to ±0.05%>. For example, the term "substantially all" can encompass all of something, 5% less than all, 2% less than all, 1% less than all, 0.5% less than all, or 0.1% less than all. By way of another example, the term "substantially equal" can encompass equal to a value, ±5% of a value, ±2% of a value, ±1% of a value all, ±0.5% of a value, or ±0.1% of a value. In some instances, the approximating language may correspond to the precision of an instrument for measuring the value. In some instances, the approximating language may correspond to the precision of an instrument for measuring the value.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements but is not limited to possessing only those one or more steps or elements. Likewise, a step of a method or an element of a device that "comprises," "has," "includes" or "contains" one or more features possesses those one or more features but is not limited to possessing only those one or more features. Furthermore, a device or structure that is configured in a certain way is configured in at least that way but may also be configured in ways that are not listed.

Further, the terms "connect," "connected," "contact" and/or the like are broadly defined herein to encompass a variety of divergent arrangements and assembly techniques. These arrangements and techniques include, but are not limited to (1) the direct coupling of one component and another component with no intervening components therebetween (i.e., the components are in direct physical contact); and (2) the coupling of one component and another component with one or more components therebetween, provided that the one component being "connected to" or "contacting" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact and/or fluid contact with one another. Moreover, two components that are electrically connected or fluidly connected may or may not be in direct physical contact, and one or more other components may be positioned therebetween.

As used herein, a "flow cell" can include a device having a lid extending over a reaction structure to form a flow channel therebetween that is in communication with a plurality of reaction sites of the reaction structure and can include a detection device that is configured to detect designated reactions that occur at or proximate to the reaction sites. A flow cell may include a solid-state light detection or "imaging" device, such as a Charge-Coupled Device (CCD) or Complementary Metal-Oxide Semiconductor (CMOS) (light) detection device. As one specific example, a flow cell may be configured to fluidically and electrically couple to a cartridge (having an integrated pump), which may be configured to fluidically and/or electrically couple to a bioassay system. A cartridge and/or bioassay system may deliver a reaction solution to reaction sites of a flow cell according to a predetermined protocol (e.g., sequencing-by-synthesis), and perform a plurality of imaging events. For example, a cartridge and/or bioassay system may direct one or more reaction solutions through the flow channel of the flow cell, and thereby along the reaction sites. At least one of the reaction solutions may include four types of nucleotides having the same or different fluorescent labels. The nucleotides may bind to the reaction sites of the flow cell, such as to corresponding oligonucleotides at the reaction sites. The cartridge and/or bioassay system may then illuminate the reaction sites using an excitation light source (e.g., solid-state light sources, such as light-emitting diodes (LEDs)). The excitation light may have a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors of the flow cell.

Flow cells described herein may be configured to perform various biological or chemical processes. More specifically, the flow cells described herein may be used in various processes and systems where it is desired to detect an event, property, quality, or characteristic that is indicative of a designated reaction. For example, flow cells described herein may include or be integrated with light detection devices, biosensors, and their components, as well as bioassay systems that operate with biosensors.

The flow cells may be configured to facilitate a plurality of designated reactions that may be detected individually or collectively. The flow cells may be configured to perform numerous cycles in which the plurality of designated reactions occurs in parallel. For example, the flow cells may be used to sequence a dense array of DNA features through iterative cycles of enzymatic manipulation and light or image detection/acquisition. As such, the flow cells may be in fluidic communication with one or more microfluidic channels that deliver reagents or other reaction components in a reaction solution to a reaction site of the flow cells. The reaction sites may be provided or spaced apart in a predetermined manner, such as in a uniform or repeating pattern. Alternatively, the reaction sites may be randomly distributed. Each of the reaction sites may be associated with one or more light guides and one or more light sensors that detect light from the associated reaction site. In one example, light guides include one or more filters for filtering certain wavelengths of light. The light guides may be, for example, an absorption filter (e.g., an organic absorption filter) such that the filter material absorbs a certain wavelength (or range of wavelengths) and allows at least one predetermined wavelength (or range of wavelengths) to pass therethrough. In some flow cells, the reaction sites may be located in reaction recesses or chambers, which may at least partially compartmentalize the designated reactions therein.

As used herein, a "designated reaction" includes a change in at least one of a chemical, electrical, physical, or optical property (or quality) of a chemical or biological substance of interest, such as an analyte-of-interest. In particular flow cells, a designated reaction is a positive binding event, such as incorporation of a fluorescently labeled biomolecule with an analyte-of-interest, for example. More generally, a designated reaction may be a chemical transformation, chemical change, or chemical interaction. A designated reaction may also be a change in electrical properties. In particular flow cells, a designated reaction includes the incorporation of a fluorescently-labeled molecule with an analyte. The analyte may be an oligonucleotide and the fluorescently-labeled molecule may be a nucleotide. A designated reaction may be detected when an excitation light is directed toward the oligonucleotide having the labeled nucleotide, and the fluorophore emits a detectable fluorescent signal. In another example of flow cells, the detected fluorescence is a result of chemiluminescence or bioluminescence. A designated reaction may also increase fluorescence (or Forster) resonance energy transfer (FRET), for example, by bringing a donor fluorophore in proximity to an acceptor fluorophore, decrease FRET by separating donor and acceptor fluorophores, increase fluorescence by separating a quencher from a fluorophore, or decrease fluorescence by co-locating a quencher and fluorophore.

As used herein, "electrically coupled" refers to a transfer of electrical energy between any combination of a power source, an electrode, a conductive portion of a substrate, a droplet, a conductive trace, wire, other circuit segment and the like. The term electrically coupled may be utilized in connection with direct or indirect connections and may pass through various intermediaries, such as a fluid intermediary, an air gap and the like.

As used herein, a "reaction solution," "reaction component" or "reactant" includes any substance that may be used to obtain at least one designated reaction. For example, potential reaction components include reagents, enzymes, samples, other biomolecules, and buffer solutions, for example. The reaction components may be delivered to a reaction site in the flow cells disclosed herein in a solution and/or immobilized at a reaction site. The reaction components may interact directly or indirectly with another substance, such as an analyte-of-interest immobilized at a reaction site of the flow cell.

As used herein, the term "reaction site" is a localized region where at least one designated reaction may occur. A reaction site may include support surfaces of a reaction structure or substrate where a substance may be immobilized thereon. For example, a reaction site may include a surface of a reaction structure (which may be positioned in a channel of a flow cell) that has a reaction component thereon, such as a colony of nucleic acids thereon. In some flow cells, the nucleic acids in the colony have the same sequence, being for example, clonal copies of a single stranded or double stranded template. However, in some flow cells a reaction site may contain only a single nucleic acid molecule, for example, in a single stranded or double stranded form.

Reference is made below to the drawings, which are not drawn to scale for ease of understanding, wherein the same reference numbers are used throughout different figures to designate the same or similar components.

FIG. 1 is a cross-sectional view of one example of a sensor wafer 100 including a plurality of sensors therein, in accordance with one or more aspects of the present disclosure. The sensors include, for example, an active surface 115, inactive surface 116, and sensor bond pads 126. Dashed lines 105 indicate the dicing of the sensor wafer 100 into separate sensors 121, 123, and 125.

In one example, a sensor surface may be comprised of an active surface and an inactive surface. As used herein, the term "sensor surface" refers to the active surface and the inactive surface. As used herein, the term "active surface" refers to a surface or surface portion of a sensor where sensing actively takes place. The terms "active surface" and "active sensor surface" may be used interchangeably herein. For example, the active surface of a digital image sensor is the surface including the photosites or pixels for sensing light. Non-limiting examples of the function(s) of the sensor include, for example, light sensing (e.g., having a predetermined range of wavelengths sensed), detecting the presence of one or more substances (e.g., biological or chemical substance) and detecting a change in concentration of a substance (e.g., ion concentration). Biological or chemical substance includes biomolecules, samples-of-interest, analytes-of-interest, and other chemical compound that may be used to detect, identify, or analyze other chemical compounds, or function as intermediaries to study or analyze other chemical compounds. In one example, the active surface is a continuous region, while in another example, the active surface may comprise discrete regions on the sensor surface. As used herein, the term "inactive surface" refers to a surface or surface portion of a sensor that is not configured to perform sensing. In one example, the inactive surface is a continuous region that surrounds the active surface and extends along the perimeter of the sensor surface. In another example, the inactive surface may comprise discrete regions on the sensor surface that are adjacent to one or more active surfaces. The inactive surface may include, for example, the sensor bond pads 126 as shown in FIG. 1.

As used herein, a "sensor" may include, for example, one or more semiconductor materials, and may take the form of, for example, a Complementary Metal-Oxide Semiconductor (CMOS) detection device (e.g., a CMOS imager) or a Charge-Coupled Device (CCD), another type of image detection device. The circuitry of a CMOS detection device may include passive electronic elements, such as a clock and timing generation circuit, an analog-to-digital converter, etc., as well as an array of photodetectors to convert photons (light) to electrons that are then converted to a voltage. The sensor may be fabricated on a silicon substrate (e.g., a silicon wafer), from which it is subsequently cut from. The thickness of the sensor may depend on the size of the silicon wafer that it is fabricated on. "Size" may refer to the diameter in one example where the silicon wafer is circular. For example, a standard silicon wafer with a 51 mm diameter may have a thickness of about 275 micrometers (μm), while a standard silicon wafer with a diameter of 300 mm may have a thickness of about 775 microns. Further, wafers may be thinned down to a desired thickness by techniques such as grinding or chemical-mechanical polishing (CMP). As used herein, the active area of the sensor(s) refers to the sensor surface that will come into contact with the reaction components for sensing. Although the present example includes planar sensor devices, it will be understood that non-planar devices may instead be used, or a combination thereof. A sensor may comprise additional components. For example, a sensor may also include light filters, reaction chambers, passivation layers, and functionalized coatings, etc., as described herein.

As used herein, "CMOS detection device" and "CMOS imager" refer to sensors fabricated using CMOS technology or sensors comprising a CMOS element. One example of the fabrication of a semiconductor device fabricated using CMOS technology will now be provided. Starting, for example, with a p-type semiconductor substrate, the NMOS (negative channel metal oxide semiconductor) region may be protected while an n-type well is created in the PMOS (positive channel metal oxide semiconductor) region. This may be accomplished using, for example, one or more lithographic processes. A thin gate oxide and gate (e.g., polysilicon) may then be formed in both the NNIOS and PMOS regions. N+ type dopant regions may be formed in the p-type substrate of the NMOS region on either side of the dummy gate (i.e., the source and drain are formed), and one region of the n+ type dopant as the body (here, the well) contact in the PMOS region. This may be accomplished using, for example, a mask. The same process of masking and doping may then be used to form the source and drain in the PMOS region and the body contact in the NMOS region. Metallization to form the terminals to the various regions of the NMOS and PMOS transistors (i.e., body, source, drain and gate) may then be performed.

The "complementary" aspect of the name refers to the inclusion of both n-type and p-type metal-oxide semiconductor field effect transistors (MOSFETs) in integrated circuits (ICs) fabricated using CMOS technology. Each MOS-FET has a metal gate with a gate dielectric, such as an oxide (hence, the "Metal-Oxide" part of the name) and a semiconductor material below the gate (corresponds to "Semiconductor" in the name). ICs are fabricated on a portion of a semiconductor substrate or wafer that is cut out after fabrication, and ICs fabricated using CMOS technology are characterized by, for example, high noise immunity and low static power consumption (one of the transistors is always off).

In one example, a CMOS detection device may include, for example, millions of photodetectors, also called pixels. Each pixel includes a photosensor, which accumulates charge from the light, an amplifier to convert the accumulated charge into a voltage, and a pixel-select switch. Each pixel may also include, for example, an individual microlens to capture more of the light, or have other enhancements to improve the image such as, for example, noise reduction. In one example, a CMOS detection device is about 9200 μm long, about 8000 μm wide, and about 600-1000 μm thick. In one example, the CMOS detection device is 680 μm thick. The CMOS detection device can comprise a pixel array. In one example, the pixel array is 4384×3292 pixels, with overall dimensions of 7272 μm×5761 μm.

In one example, the sensor comprises a biosensor that includes a reaction structure with a plurality of reaction sites configured to detect designated reactions that occur at or proximate to the reaction sites. A sensor may include a solid-state light detection or imaging device (e.g., CCD or CMOS light detection device) and, optionally, a flow cell mounted thereto. The flow cell may include at least one flow channel that is in fluid communication with the reaction sites to direct a reaction solution thereto. The plurality of reaction sites may be randomly distributed along the reaction structure or arranged in a predetermined manner (e.g., side-by-side in a matrix, such as in microarrays). A reaction site can also include a reaction chamber or recess that at least partially defines a spatial region or volume configured to compartmentalize the designated reaction. A reaction recess may be at least partially separated from the surrounding environment or other spatial regions. For example, the reaction recesses may be nanowells comprising an indent, pit, well, groove, cavity or depression defined by interior surfaces of a detection surface and have an opening or aperture (i.e., be open-sided) so that the nanowells can be in fluid communication with a flow channel.

As one specific example, the sensor is configured to fluidically and electrically couple to a bioassay system. The bioassay system may deliver a reaction solution to the reaction sites according to a predetermined protocol (e.g., sequencing-by-synthesis) and perform a plurality of imaging events. For example, the bioassay system may direct reaction solutions to flow along the reaction sites. At least one of the reaction solutions may include four types of nucleotides having the same or different fluorescent labels. The nucleotides may bind to the reaction sites, such as to corresponding oligonucleotides at the reaction sites. The bioassay system may then illuminate the reaction sites using an excitation light source (e.g., solid-state light sources, such as light-emitting diodes (LEDs)). The excitation light may have a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors.

FIG. 2 is a cross-sectional view of one example of preparation for and placement of the sensors from sensor wafer 100 FIG. 1 onto a substrate 130, in accordance with one or more aspects of the present disclosure, e.g., sensors 121, 123 and 125. For the following discussion, reference will be made to sensor 121. By way of example, substrate 130 may be in wafer form or panel form. In one example, the substrate 130 may comprise, or take the form of, a dielectric layer, or a multi-layered dielectric, with one or more conductive pathways therethrough. In another example, the substrate may instead take the form of a dielectric layer without conductive pathways Non-limiting examples of dielectric materials that may be used in the dielectric layer include low-k dielectric materials (dielectric constant less than that of silicon dioxide, about 3.9), such as glass-reinforced epoxy laminates, polyamides, fluorine-doped silicon dioxide, carbon-doped silicon dioxide and porous silicon dioxide, and high-k dielectric materials (dielectric constant above about 3.9), such as silicon nitride (SiNx) and hafnium dioxide. Sensor 121 may be attached to the substrate 130 using, for example, a die-attach adhesive paste or film that may provide, for example, low or ultra-low stress on the sensor and high temperature stability. Examples of die-attach pastes include Supreme 3HTND-2DA and EP3HTSDA-1 by MasterBond (USA), and LOCTITE ABLESTIK ATB-F100E by Henkel Corp. USA An example of a die attach adhesive film is LOCTITE ABLESTIK CDF100 by Henkel Corp. (USA). In one example, the sensor may be directly attached to the substrate, while in other examples a structure, coating or layer may be interposed between the substrate and the sensor. Sensor 121 includes active surface 115, inactive surface 116, and sensor bond pads 126. In one example, the conductive pathways through substrate 130 include topside substrate bond pads 145, electrical vias 150, and bottom side substrate bond pads 155. In one example, topside substrate bond pads 145 are part of a land grid array (LGA) which may comprise a printed circuit board (PCB) or ceramic material. Thus, the sensor 121 is electrically connected to the bottom side substrate bond pads. In one example, the surface of the sensor includes one or more reaction recesses 106. In one example, the reaction recesses 106 are nanowells. In one example, the substrate 130 may contain numerous metal layers.

In one example, a passivation layer is provided on the sensor surface to protect the sensor from harmful reaction components and serve as a support surface or substrate for wafer level chemistries. The passivation layer may comprise a single layer or multiple layers. In the example of multiple layers, the different layers may comprise the same or different materials. In one example, the passivation layer comprises an oxide, such as silicon dioxide, or silicon oxy-nitride. In another example, the passivation layer comprises a metal oxide, such as tantalum pentoxide (Ta2Os). In another example, the passivation layer may comprise a low-temperature film such a silicon nitride ($Si_xN_y$). For example, the passivation layer may include multiple layers in which at least one of the sub-layers includes tantalum pentoxide (Ta2Os) and at least one of the sub-layers includes a low-temperature film. In some aspects, the passivation layer has a thickness within the range of about 5 nanometers to about 500 nanometers. The passivation layer may have a substantially flat surface or may be patterned to include channels and/or features such as reaction recesses. The passivation layer may be formed, for example, by chemical vapor deposition (CVD) processes such as plasma-enhanced CVD (PECVD) or low pressure CVD (LPCVD). In one example, reaction recesses 106 are formed in the passivation layer. The reaction recesses 106 on the substrate may be fabricated using, for example, semiconductor manufacturing technology, such that the reaction recesses may be patterned and etched into the passivation layer or other substrate over the sensor surface. The reaction recesses may define reaction areas containing reaction sites for conducting desired reactions.

FIG. 3 is a cross-sectional view of one example of forming wire bonds to electrically connect the sensors to the substrate. Wire bonds 140 connect the sensor bond pads 126 to the topside substrate bond pads 145 which are electrically connected to bottom substrate bond pads 155 through a single via 150 as shown in FIG. 3, or alternatively, through several vias that extend through multiple metallic layers of substrate 130. The wire bonds may be composed of one or more metals, such as aluminum, copper, silver, gold, or any combination thereof. The metals in the wire bonds may be in elemental form, alloy form, or a composite form. For example, the wire bonding may comprise, for example, forming a eutectic metal bond.

FIG. 4 is a cross-sectional view of one example of a molding layer 160 formed over the substrate 130. In one example, the molding layer is formed directly on the substrate, while in another example an intermediate structure (e.g., a coating or layer) may be interposed between the molding layer and the substrate. The molding layer 160 covers the surface of the substrate 130, including the substrate bond pads 145. The molding layer also covers the sides of sensor 121, wire bonds 140, and the sensor bond pad 126. Depending on the geometry of the sensor, the molding layer may cover the different sides of the sensor at different extents or at the same extent. Molding layer 160 has openings or apertures 118 corresponding to the active surfaces of the sensors, e.g., active surface 115 of sensor 121. In the example of FIG. 4, the apertures 118 encompass the active surface 115 as well as a portion of the inactive surface 116. In another example (e.g., the example shown in FIG. 22), the apertures 118 do not encompass (i.e., do not expose) a portion of the inactive surface 116. The portion of the molding layer 160 over the sensor surface, i.e., molding overhang 161, may be angled (e.g., at 45 degrees or more) to enable more convenient release of the mold from the sensors during fabrication. In this example, the thickness of the molding overhang 161 increases moving from the sensor bond pad to the periphery or outer edge of the sensor. However, in another example, the thickness of the molding overhang may be substantially uniform. The molding layer 160 is configured to have a top surface that is sufficiently planar to enable a lidding layer to be placed on top of the molding layer 160 (as shown in FIG. 5). The molding layer 160 is formed to a height relative to a top surface of the substrate 130 (i.e., "molding height") that is greater than the height of the active surface 115 of the sensor 121 relative to the top surface of the substrate 130 (i.e., "active surface height"). Referring to FIG. 4, the molding height is represented by "h2" and the active surface height is represented by "h1." In one example, the molding height is about 40 micrometers to about 200 micrometers greater than the active surface height. In one example, the molding height is about 75 micrometers greater than the active surface height. In another example, the molding height is about 100 micrometers greater than the active surface height. Thus, the thickness of the molding layer is controlled to adjust the height of a lidding layer over the sensor surface 115 as described below in connection with FIG. 5.

Non-limiting examples of the material of the molding layer 160 include, for example, an epoxy or a plastic molding compound (e.g., phenolic hardeners, silicas, catalysts, pigments and mold release agents). During the formation of the molding layer, the sensor surface may be protected with, for example, a protective layer (e.g., a mechanical fixture such as a molding pin) that is removed after the molding layer is deposited to provide an aperture above the active surface (e.g., aperture 118 of FIG. 4). Alternatively, the molding layer may be conformally deposited, then planarized down to the sensor(s). In one example of conformal deposition and planarization, the molding layer may be blanketly deposited over the structure, followed by a planarization process (e.g., chemical-mechanical polishing (CMP)) to a desired thickness above the sensor surface. Also, although the molding layer is described as a single layer in this example, it will be understood that the molding layer may be comprised of multiple layers. For example, molding layer 160 could be formed in multiple steps with multiple materials.

Figure 11:
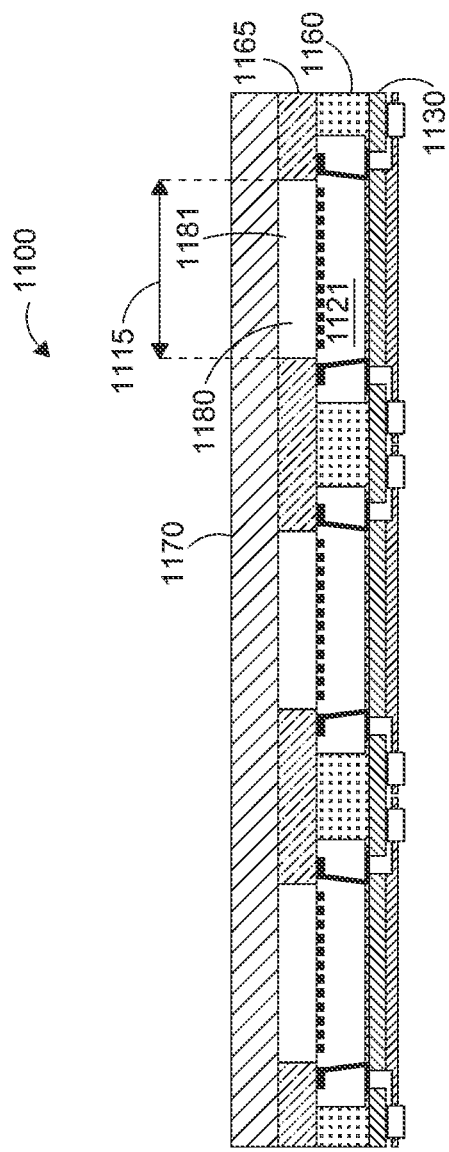

FIG. 5A is an example of a top view of the structure of FIG. 4, depicting sensors 121, 123, and 125 over substrate 130. Sensor 121 includes active surface 115, sensor bond pads 126, bond wires 140, and substrate bond pads 145, as described above in connection with FIGS. 2-4. FIG. 5B is a cross-sectional view through dashed line "X" of FIG. 5A after placement of a lidding layer 170 over molding layer 160, in accordance with one or more aspects of the present disclosure, to form a flow cell. In one example, lidding layer 170 is in direct contact with the molding layer 160. In another example, lidding layer 170 and molding layer 160 are not in direct contact and are separated by an intermediate layer (e.g., spacer or interposer layer), coating or film as shown in the example of FIG. 11. The placement of the lidding layer 170 may be accomplished using, for example, relatively precise robotic machines (also known as pick-and-place machines), resulting in a space 181 over the active surface 115 of the sensor 121. In one example, the placement of the lidding layer 170 over the molding layer 160 and over the sensor surface form a space 181 over the active surface of the sensor that defines a flow channel.

As such, the molding layer 160 serves as a spacer between the lidding layer 170 and the sensor surface. In one example, the space 181 over the active surface defines a flow channel 180 of a flow cell. In the example shown in FIG. 5B, the flow channel 180 encompasses the entire active surface 115 of sensor 121 as well as a portion of the inactive surface 116 of sensor 121. As used herein, the flow channel is said to "encompass" surfaces that form the space 181 that defines the flow channel. For example, referring to FIG. 5B, the flow channel 180 encompasses active surface 115 and a portion of inactive surface 116. Similarly, flow channel 180 encompasses the portions of the molding layer 160 and the lidding layer 170 that form space 181. In one example, the flow channel 180 encompasses substantially all of the active surface 115 of the sensor 121. In another example, the flow channel 180 encompasses more than about half of the active surface 115 of the sensor 121.

Figure 5C:
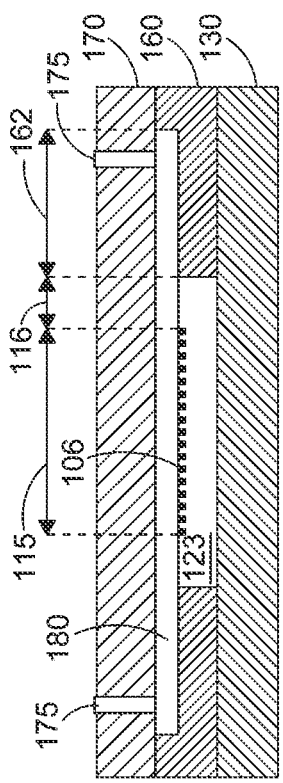
FIG. 5C is a cross-sectional view through dashed line "Y" of FIG. 5A following lidding layer attachment, in accordance with one or more aspects of the present disclosure.

FIG. 5C is a cross-sectional view through dashed line "Y" through sensor 123 of FIG. 5A after placement of a lidding layer 170 over molding layer 160, in accordance with one or more aspects of the present disclosure, to form a flow cell. Lidding layer 170 includes inlet and outlet ports 175 that provide for inflow and outflow of fluids into the flow channel 180. Each of the inlet and outlet ports can serve as either an inlet or an outlet, depending on the direction of the flow. With reference to FIG. 5C, either of the ports 175 can serve as the inlet port or the outlet port. As shown in the view of FIG. 5C, the flow channel encompasses the entire active surface 115 of sensor 123, the entire inactive surface 116 of sensor 123, as well as portions of the molding layer 160. The horizontal portions of the molding layer 160 encompassed by the flow channel 180, i.e., molding layer surface 162, provides a distance between the inlet/outlet ports 175 and the active surface of the sensor. Thus, molding layer surface 162 is between the inlet/outlet ports 175 and the active surface of the sensor. As such, fluid flowing into the fluid channel 180 from a port 175 is able to reach a more uniform flow before reaching the sensor surface of the sensor, which is desirable for the detection of designated reactions and more efficient utilization of the active sensor surface. In one example, the flow channel 180 encompasses substantially all of the active surface 115 of the sensor 123. In another example, the flow channel 180 encompasses more than about half of the active surface 115 of the sensor 123.

The formation of the molding layer in the areas outside the active surface of the sensor 115, rather than on the active surface of the sensor may be referred to as a fan-out packaging process. The fan-out packaging process described herein provides for greater utilization of the active sensor surface by, for example, providing electrical pathways and lidding methods that improve utilization of the active sensor surface. The lidding layer may include materials that are unreactive with and transparent to incoming light or other waves that may trigger a sensing action from a sensor. It is desired for the lidding layer material to have low autofluorescence or be non-fluorescent to facilitate, for example, the detection of a fluorescent reaction in the flow cell. The material of the lidding layer 170 may be a low autofluorescence plastic or glass. In one example, the lidding layer may be an aluminosilicate glass. In another example, the lidding layer may be a borosilicate glass (e.g., alkaline earth boro-aluminosilicate glass, such as Eagle XG® glass by Corning, USA). In another example, the lidding layer may be a floated borosilicate glass (e.g., Borofloat® 33 glass by Schott AG, Germany). The thickness of lidding layer can be, for example, from about 300 μm to about 1000 μm. Substance (s), for example, biological or chemical substances(s), may be introduced into the flow channel 180 for sensing by the active surface of the sensor.

In one example, the active surface of the sensor has a relatively uniform low roughness, i.e., the active surface is as smooth as allowed by suitable fabrication process. In another example, multiple channels for liquid(s) may be present in a secondary layer over the sensor in the space. The optional secondary layer may include, for example, glass as described above, on the sensor surface. Such a secondary layer may have a roughness substantially equal to that of the active surface of the sensor and a seamless interface with the active surface to enable fluidic exchange with reduced, and in some instances, minimum, or even no, entrainment or entrapment of the fluid(s).

Figure 6:
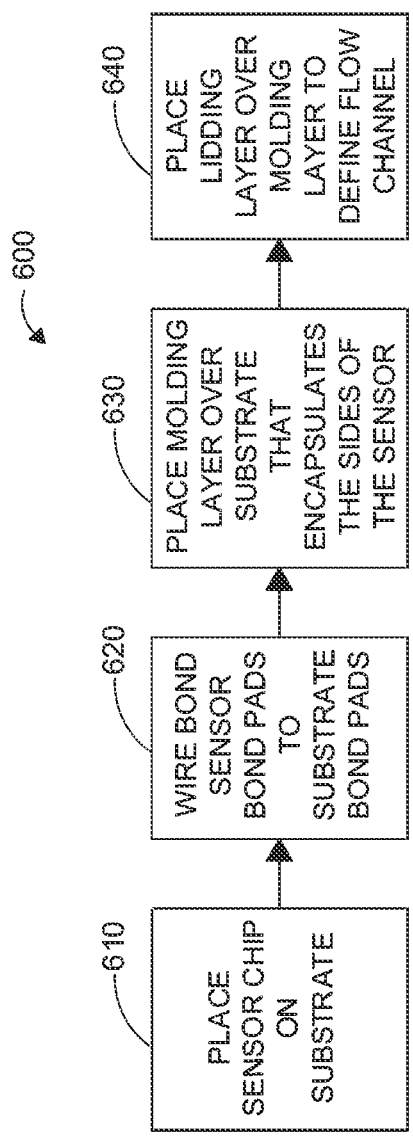
FIG. 6 is a flow diagram of one example of fabricating the apparatus disclosed in FIG. 5B, in accordance with one or more aspects of the present disclosure.

One example of a process 600 for fabricating the apparatus of FIG. 5B in accordance with the present disclosure will now be described with respect to the flow diagram of FIG. 6. In one example, sensors are fabricated on a wafer as described above with respect to FIG. 1. While that example relates to a CMOS detection device, other types of active-pixel sensors may be used. For example, charge-coupled devices (CCDs) and other technologies, such as, for example, NMOS image sensor technology (also known as live MOS sensors) and image sensors with various color filters, e.g., microcolor splitters, which differ from the Bayer Color Filter Array (an array of tiny microfilters) in that they diffract light so that various combinations of wave lengths (colors) hit different photosites. A Live MOS Sensor offers image quality comparable to a Full Frame Transfer (FFT) CCD sensor with the low power needs of a CMOS detection device, and in some examples can have high-quality imaging capabilities over an extended period of time. Simplified circuitry that reduces the distance from each photodiode to its corresponding microlens (making for a denser, higher resolution sensor) may facilitate excellent sensitivity and image quality even when light strikes it at a high angle of incidence. In one example, sensor fabrication can include the formation of a passivation layer (as described above in connection with FIG. 2) on the sensor surface to protect the sensor from harmful reaction components and serve as a support surface for wafer level chemistries.

Wafer level chemistry may be applied to all or a portion of the sensor surface (i.e., a "functionalized coating") to facilitate immobilizing biomolecules (or biological or chemical substances) thereto. The functionalized coating may include a plurality of functionalized molecules, which in some aspects, include polymer coatings covalently attached to the surface of a passivation layer over the substrate. The polymer coatings, such poly(N-(5-azidoacetamidylpentyl)acrylamide-co-acrylamide) (PAZAM), are used in the formation and manipulation of substrates, such as molecular arrays and flow cells. The passivation layer may be coated, in at least one area, by using beads coated with a covalently attached polymer, such as PAZAM and used in determining a nucleotide sequence of a polynucleotide attached to a substrate surface, in some aspects. In some examples, nucleic acids can be immobilized to the functionalized sensor surface, such as to surfaces of reaction recesses (e.g., nanowells). Natural nucleotides and enzymes that are configured to interact with the natural nucleotides maybe utilized. Natural nucleotides include, for example, ribonucleotides or deoxyribonucleotides. Natural nucleotides can be in the mono-, di-, or tri-phosphate form and can have a base selected from adenine (A), Thymine (T), uracil (U), guanine (G) or cytosine (C). It will be understood, however, that non-natural nucleotides, modified nucleotides or analogs of the aforementioned nucleotides can be utilized.

At 610 one or more sensors are placed over a substrate. By way of example, the sensors may be provided from a sensor wafer that has been diced and singulated. The placement of the sensor over the substrate may include preparation, which may involve, for example, lithographic and plating processes, and placement may be accomplished using, for example, precise robotic machines (also known as pick-and-place machines). In one example, this may panelization may then be performed to join the sensor and the supporting layer. Panelization may include, for example, carrier lamination, attaching the sensor to a die, positioning the die on the supporting layer and fixing with a molding compound, planarization (or "top grind") of the molding compound and backside film lamination.

Next, at 620, sensor bond pads (e.g., sensor bond pads 126 of FIG. 4) are wire bonded to substrate bond pads (e.g., substrate bond pads 145 of FIG. 4). At 630, a molding layer is formed over the substrate but not over the active sensor surface. The molding layer formation may include covering/protecting the sensor surface(s) with, for example, a protective layer (e.g., a mechanical fixture such as a molding pin) that is removed after the molding layer is deposited. By way of example, the molding layer may be deposited in a liquid or solid form and formed using compression molding.

At 630, a lidding layer is placed over the molding layer and over the sensor surface to define a flow channel. The placement of the lidding layer may be done using, for example, a surface mount process. In this example, lidding is performed at the wafer level, but in another example, lidding can be done after dicing. In the surface mount process, the lidding layer is positioned over the molding layer using, for example, the precise robotic machines described above, and attached in some manner (e.g., using epoxy). Such machines may be used to place surface-mount devices onto a printed circuit board or similar structure. Such machines may use, for example, pneumatic suction cups manipulated in three dimensions to effect placement of the lidding layer. The molding layer may be in direct contact with the lidding layer, or alternatively, may be separated by a coating, film, or other material layer. The composition of the lidding layer can be as described above in connection with FIG. 4. By way of example, the lidding layer may be a glass wafer that is bonded to the molding layer. Following process 600, for example, the substrate can be diced into individual dies each containing one or more flow cell sensors.

FIG. 7 is a cross-sectional view of one example of a sensor wafer 700 comprising a plurality of sensors thereon, in accordance with one or more aspects of the present disclosure. The sensors include, for example, an active surface 715 and sensor bond pads 726. Dashed lines 705 indicate the dicing of the sensor wafer 700 into separate sensors (i.e., sensors 721, 723 and 725 shown in FIG. 8). Sensor 721 includes sensor bond pads 726. The sensor bond pads 726 are electrically connected with a through silicon via (TSV) 727 that extends through the sensor 721 and electrically connects the sensor bond pads 726 to a sensor redistribution layer (RDL) 728 disposed on a bottom or backside side of the sensor 721 (also referred to herein as a "sensor RDL"). Thus, the sensor 721 is electrically connected to the RDL 728 through the sensor bond pads 726 and TSV 727. The TSV 727 may be composed of transition metal, such as tungsten or other similar materials. The sensor RDL 728 may be composed of a metal, such as tungsten, copper, gold, nickel, or other similar materials. In one example, and as discussed above, reaction recesses 706 can be formed in or by a passivation layer formed on the sensor surface. The reaction recesses 706 may be fabricated using, for example, semiconductor manufacturing technology, such that the reaction recesses may be patterned and etched into the passivation layer or other substrate over the sensor surface. The reaction recesses may define reaction areas containing reaction sites for conducting desired reactions. In one example, the reaction recesses 706 are nanowells.

FIG. 8 is a cross-sectional view of one example of the placement of the diced sensors of FIG. 7 onto a substrate 730, in accordance with one or more aspects of the present disclosure. For the following discussion, reference will be made to sensor 721. By way of example, substrate 730 may be in wafer form or panel form and may take the form of a dielectric layer with one or more conductive pathways therethrough. Non-limiting examples of dielectric materials are described above in connection with substrate 130 of FIG. 2. Sensor 721 may be attached to the substrate 730 using, for example, a die-attach adhesive paste or film that may provide, for example, low or ultra-low stress on the sensor and high temperature stability. In one example, the sensor may be directly attached to the substrate, while in other examples a structure, coating or layer may be interposed between the substrate and the sensor. Sensor 721 includes active surface 715, inactive surface 716 and sensor bond pads 726. In one example, the conductive pathways through substrate 730 include topside substrate bond pads 729, electrical vias 750, and bottom side substrate bond pads 755. In one example, topside substrate bond pads 729 are part of a land grid array (LGA) which may comprise a printed circuit board (PCB) or ceramic material. The sensor RDL 728 is electrically connected to the substrate bond pad 729 by, for example, a ball grid array, capillary underfill, solder, die attach material, or film.

FIG. 9 is a cross-sectional view of one example of a molding layer 760 formed over the substrate 730. In one example, the molding layer is formed directly on the substrate, while in another example an intermediate structure (e.g., a coating or layer) may be interposed between the molding layer and the substrate. The molding layer 760 covers the surface of the substrate 730 and the sides of sensor 721. Molding layer 760 has openings or apertures 718 corresponding to the active surfaces of the sensors, e.g., active surface 715 of sensor 721. In one example, the molding overhang 761 is angled (e.g., at 45 degrees or more) to enable more convenient release of the mold material from the sensors as shown in FIG. 9. In other examples, the molding overhang may have a substantially uniform thickness. The molding layer 760 is configured to have a top surface that is sufficiently planar to enable a lidding layer to be placed on top of the molding layer 760 (as shown in FIG. 10B). The molding layer 760 is formed to a height relative to a top surface of the substrate 730 (i.e., "molding height") that is greater than the height of the active surface of the sensor 721 relative to the top surface of the substrate 730 (i.e., "active surface height"). Referring to FIG. 9, the molding height is represented by "h2" and the active surface height is represented by "h1." In one example, the molding height is about 40 micrometers to about 200 micrometers greater than the active surface height. In one example, the molding height is about 75 micrometers greater than the active surface height. In another example, the molding height is about 100 micrometers greater than the active surface height. Non-limiting examples of the material and fabrication of the molding layer 760 are described above in connection with FIG. 4. As described above, although the molding layer 760 is described as a single layer in this example, it will be understood that the molding layer may comprise multiple layers formed in multiple steps.

Figure 10A:
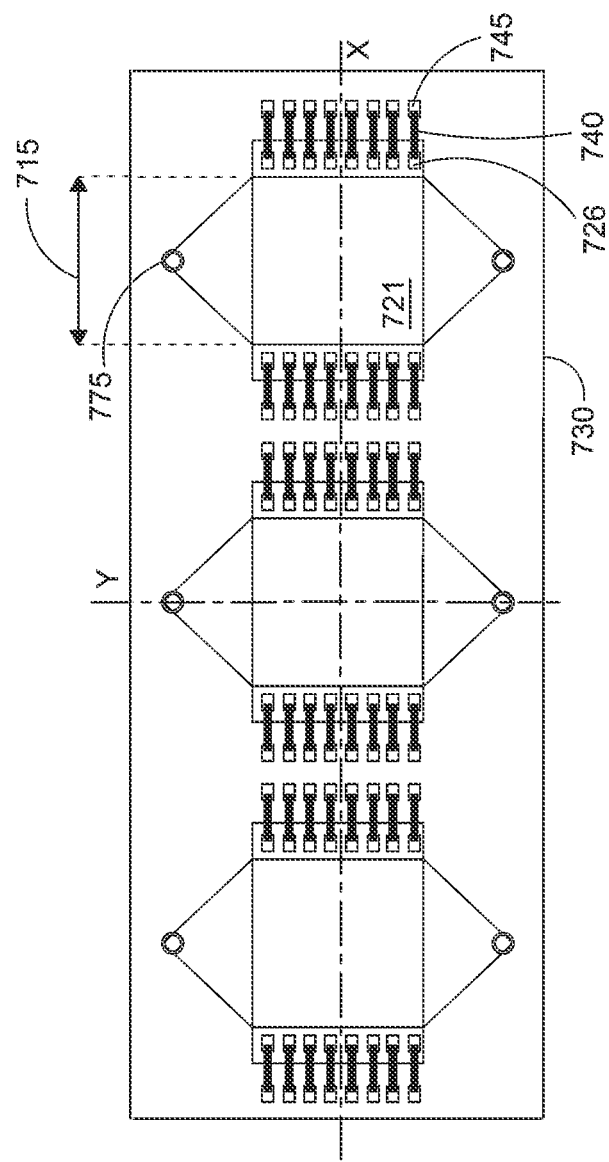
FIG. 10A is a top view of the structure of FIG. 9, in accordance with one or more aspects of the present disclosure.
Figure 10B:
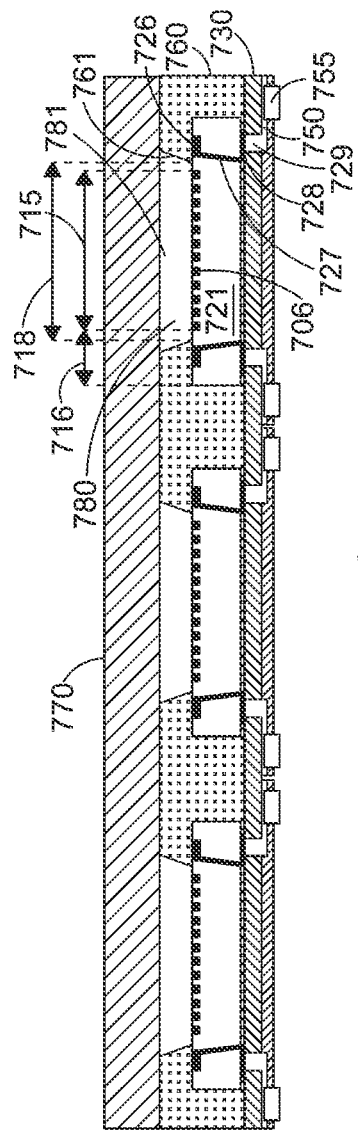
FIG. 10B is a cross-sectional view through dashed line "X" of FIG. 10A following lidding layer attachment, illustrating a fan-out structure in accordance with one or more aspects of the present disclosure.

FIG. 10A is an example of a top view of the structure of FIG. 9, depicting sensors 721, 723, and 725 over substrate 730. Sensor 721 includes active surface 715, sensor bond pads 726, bond wires 740, and substrate bond pads 745, as described above in connection with FIGS. 7-9. FIG. 10B is a cross-sectional view through dashed line "X" of FIG. 10A after placement of a lidding layer 770 over molding layer 760, in accordance with one or more aspects of the present disclosure, to form a flow cell. In one example, lidding layer 770 is in direct contact with the molding layer 760. In another example, lidding layer 770 and molding layer 760 are not in direct contact and are separated by an intermediate layer (e.g., spacer or interposer layer), coating or film as shown in the example of FIG. 11. The placement of the lidding layer 770 may be accomplished using, for example, relatively precise robotic machines (also known as pick-and-place machines), resulting in a gap or space 781 over the active surface 715 of the sensor 721. As such, the molding layer 760 serves as a spacer between the lidding layer 770 and the sensor surface. In one example, the space 781 over the active surface defines a flow channel 780 of a flow cell. In one example, the flow channel 780 encompasses the entire active surface 715 of sensor 721 as well as a portion of the inactive surface 716 of sensor 721. In one example, the flow channel 780 encompasses substantially all of the active surface 715 of the sensor 721. In another example, the flow channel 780 encompasses more than about half of the active surface 715 of the sensor 721.

Figure 10C:
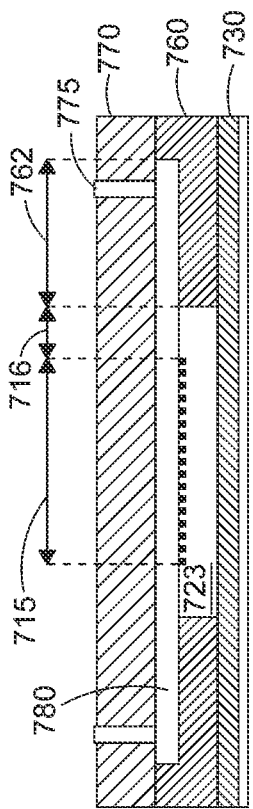
FIG. 10C is a cross-sectional view through dashed line "Y" of FIG. 10A following lidding layer attachment, in accordance with one or more aspects of the present disclosure.

FIG. 10C is a cross-sectional view through dashed line "Y" through sensor 723 of FIG. 10A after placement of a lidding layer 770 over molding layer 760, in accordance with one or more aspects of the present disclosure, to form a flow cell. Lidding layer 770 includes inlet and outlet ports 775 that provide for inflow and outflow of fluids into the flow channel 780. As shown in the view of FIG. 10C, the flow channel encompasses the entire the entire active surface 715 of sensor 723, the entire inactive surface 716 of sensor 723, as well as portions of the molding layer 760. The horizontal portions of the molding layer 760 encompassed by the flow channel 780, i.e., molding layer surface 762, provides a distance between the inlet/outlet ports 175 and the active surface of the sensor. Thus, molding layer surface 762 is between the inlet/outlet ports 775 and the active surface of the sensor. As such, fluid flowing into the fluid channel 780 from a port 775 is able to reach a more uniform flow before reaching the sensor surface of the sensor, which is desirable for the detection of designated reactions and more efficient utilization of the active sensor surface. In one example, the flow channel 780 encompasses substantially all of the active surface 715 of the sensor 723. In another example, the flow channel 780 encompasses more than about half of the active surface 715 of the sensor 723.

FIG. 11 shows an alternate structure 1100 where the molding layer 1160 is formed to a molding height being substantially equal to the active surface height. A spacer or interposer layer 1165 is formed over the molding layer 1160 and supports the lid 1170, resulting in a gap or space 1181 over the active surface 1115 of the sensor 1121 that defines flow channel 1180. In this example, the thickness of the interposer layer 1165 is controlled to adjust the height of the lidding layer over the sensor surface 1115.

Figure 12:
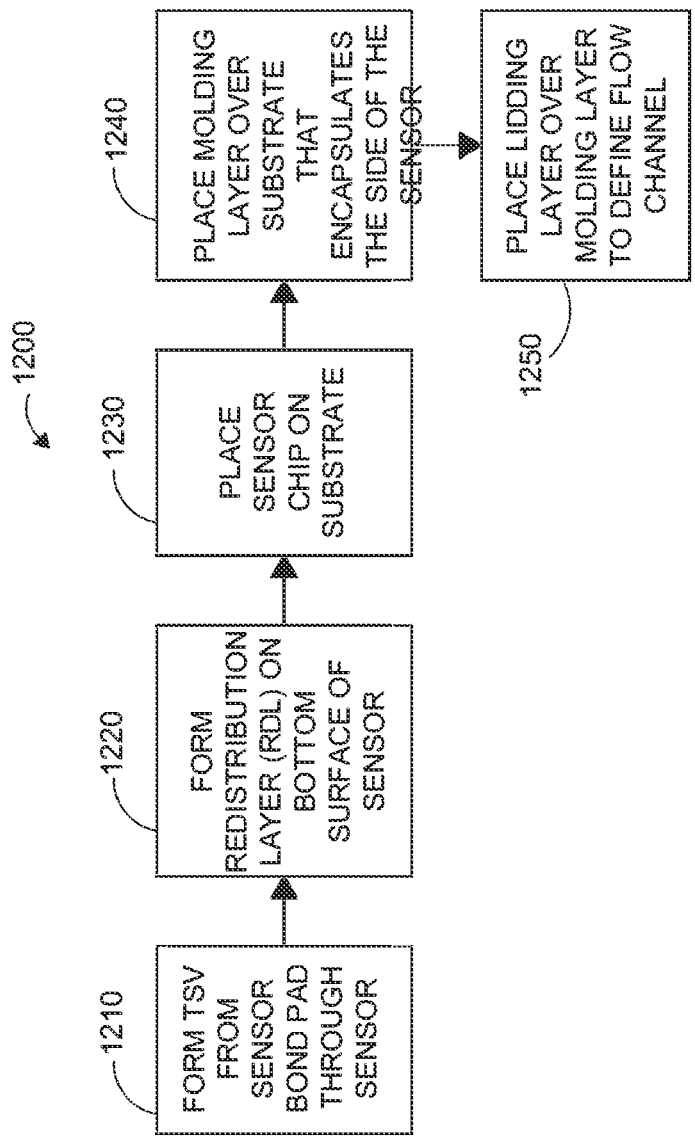
FIG. 12 is a flow diagram of one example of fabricating an apparatus disclosed in FIG. 10B, in accordance with one or more aspects of the present disclosure.

One example of a process 1200 for fabricating the apparatus of the present disclosure as depicted in FIG. 10B will now be described with respect to the flow diagram of FIG. 12. By way of example, the sensors may be prepared as described above in connection with process 600 of FIG. 6. At 1210, through silicon vias (TSVs) are formed in the wafer to provide an electrical connection to the sensor through the sensor bond pads. At 1220, a sensor redistribution layer (RDL) is formed on the bottom or backside side of the sensor wafer that is electrically connected to the TSV. This can be done by first disposing the sensor RDL over the bottom surface of the sensor wafer, then lithographically patterning and etching the sensor RDL to a predetermined shape. Subsequently, in one example, wafer level chemistry may be applied to all or a portion of the sensor surface to provide a functionalized coating as described above in connection with FIG. 6.

At 1230, one or more sensors are placed over a substrate, for example, picked and placed onto a substrate followed by panelization as described above in connection with FIG. 6. Placement of the sensors over the substrate puts the sensor RDL in electrical contact with the substrate bond pads, which may be part of a land grid array (LGA). At 1240, a molding layer is formed over the substrate, and the sides of the sensor, while leaving an opening or aperture over the sensor surface. The molding layer formation may include covering/protecting the sensor surface(s) with, for example, a protective layer (e.g., a mechanical fixture such as a molding pin) that is removed after the molding layer is deposited. The molding layer is formed to a molding height that is greater than the active surface height. Thus, the thickness of the molding layer is controlled to adjust the height of a lidding layer over the sensor surface. By way of example, the molding layer may be deposited in a liquid or solid form and formed using compression molding. At 1250, a lidding layer is placed over the molding layer and over the sensor surface using, for example, a surface mount process, to define a flow channel. Alternatively, as described above in connection with FIG. 11, a spacer or interposer layer may be formed over the molding layer and support the lidding layer. Thus, the lidding layer is not necessarily in direct contact with the molding layer. Following process 1200, the substrate can be diced into individual dies each containing one or more flow cell sensors.

FIG. 13 is a cross-sectional view of one example of a sensor wafer 1300 including a plurality of sensors thereon, in accordance with one or more aspects of the present disclosure. The sensors include, for example, an active surface 1315, inactive surface 1316, and sensor bond pads 1326. Dashed lines 1305 indicate the dicing of the sensor wafer 1300 into separate sensors (i.e., sensors 1321, 1323, and 1325 shown in FIG. 14). In one example, reaction recesses 1306 (shown in FIG. 15) are formed in or by a passivation layer formed on the sensor surface as described above. In one example, the reaction recesses 1306 are nanowells.

FIG. 14 is a cross-sectional view showing placement of the diced sensors from sensor wafer 1300 of FIG. 13 onto a substrate 1330, in accordance with one or more aspects of the present disclosure, i.e., sensors 1321, 1323 and 1325. For the following discussion, reference will be made to sensor 1321. By way of example, substrate 1330 may be in wafer form or panel form. Sensor 1321 may be attached to the substrate 1330 using, for example, a die-attach adhesive paste or film that may provide, for example, low or ultra-low stress on the sensor and high temperature stability. In one example, the sensor may be directly attached to the substrate, while in other examples a structure, coating or layer may be interposed between the substrate and the sensor. Sensor 1321 includes active surface 1315 and sensor bond pads 1326. In one example, the conductive pathways through substrate 1330 include topside substrate bond pads 1345, electrical vias 1350, and bottom side substrate bond pads 1355. In one example, topside substrate bond pads 1345 are part of a land grid array (LGA) which may comprise a printed circuit board (PCB) or ceramic material.

FIG. 15 is a cross-sectional view of one example of a first molding layer formed over the substrate, i.e., first molding layer 1360. In one example, the molding layer is formed directly on the substrate, while in another example an intermediate structure (e.g., a coating or layer) may be interposed between the molding layer and the substrate. The first molding layer 1360 covers the surface of the substrate 1330, including the substrate bond pads 1345, and covers the sides of sensor 1321. Depending on the geometry of the sensor, the molding layer may cover the different sides of the sensor at different extents or at the same extent. The molding layer 1360 is formed to a height substantially equal to the height of the active surface 1315 of the sensor 1321 and does not extend over the sensor surface.

Figure 16:
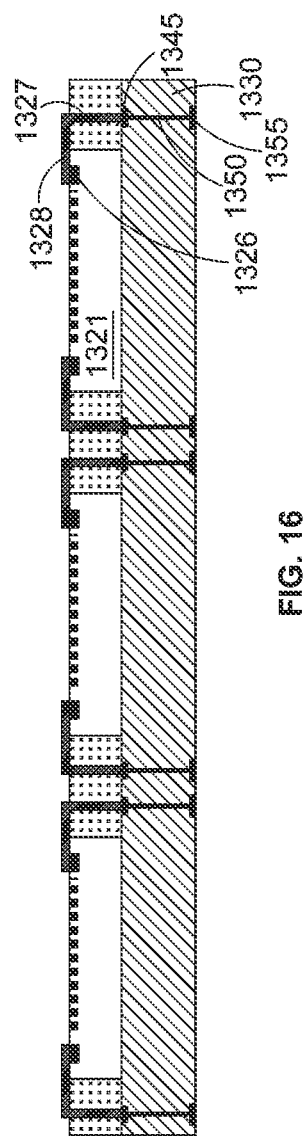

Referring to FIG. 16, a through-mold via (TMV) 1327 is formed through the first molding layer 1360 to the substrate bond pad 1345. The TMV 1327 can be made, for example, by laser drilling. The TMV 1327 can be filled with a metal, such as tungsten, copper, gold, or nickel. A sensor redistribution layer (RDL) 1328 is formed on the top side of the sensor 1321 (and top side of the first molding layer 1360) to electrically connect the sensor bond pads 1326 to the TMV 1327.

Figure 17:
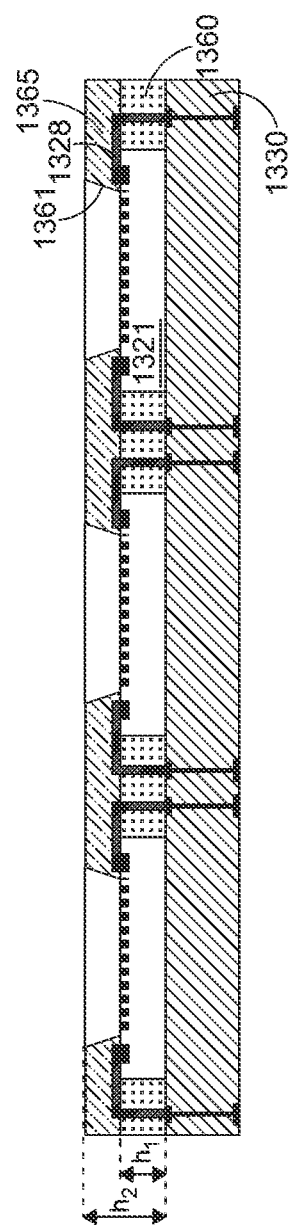

FIG. 17 depicts the addition of a second molding layer 1365 over the RDL 1328 and first molding layer 1360. As with the first molding layer, in some examples the second molding layer is a thin film or laminate. The second molding layer 1365 is configured to have a top surface that is sufficiently planar to enable a lidding layer to be placed on top of the molding layer 1365. The second molding layer 1365 has a height relative to a top surface of the substrate 1330 (i.e., molding height represented by "hi") that is greater than the height of the active surface of the sensor 1321 relative to the top surface of the substrate 1330 (i.e., active surface height represented by "h1"). In one example, the molding height is about 40 micrometers to about 200 micrometers greater than the active surface height. In one example, the molding height is about 75 micrometers greater than the active surface height. In another example, the molding height is about 100 micrometers greater than the active surface height. Thus, the thickness of the second molding layer is controlled to adjust the height of a lidding layer over the sensor surface 1315 as described below in connection with FIG. 18. The molding overhang 1361 may be angled (e.g., at 45 degrees or more) to enable more convenient release of the mold from the sensors. The first and second molding layers may be formed in accordance with the materials and techniques described above in connection with molding layer 160 of FIGS. 4-5. In other examples, the second molding layer 1360 is a thin film or laminate.

Figure 18A:
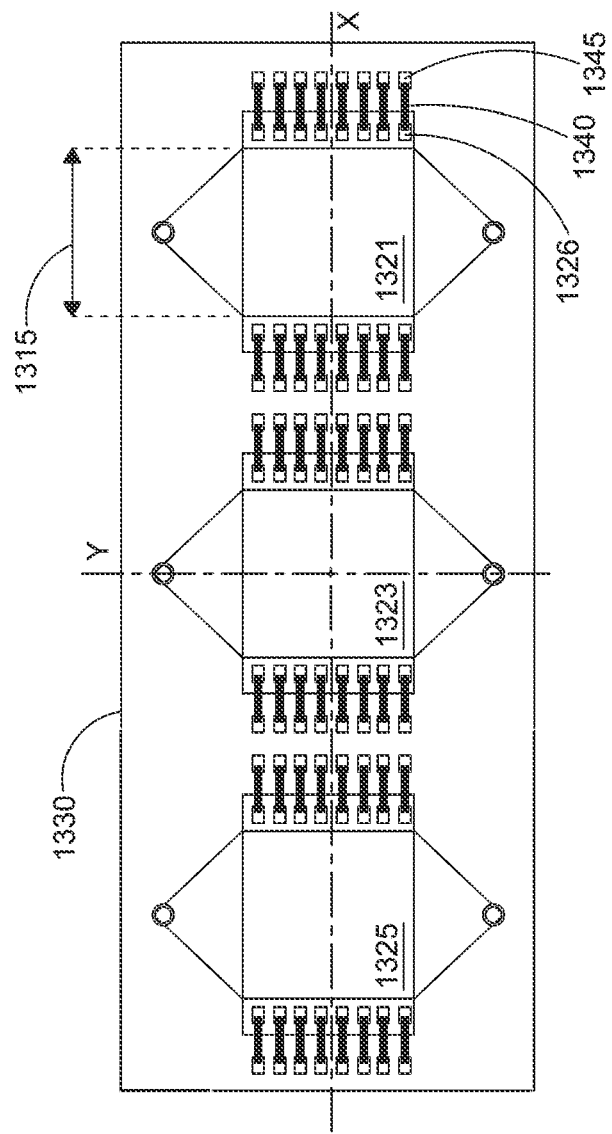
FIG. 18A is a top view of the structure of FIG. 17, in accordance with one or more aspects of the present disclosure.
Figure 18B:
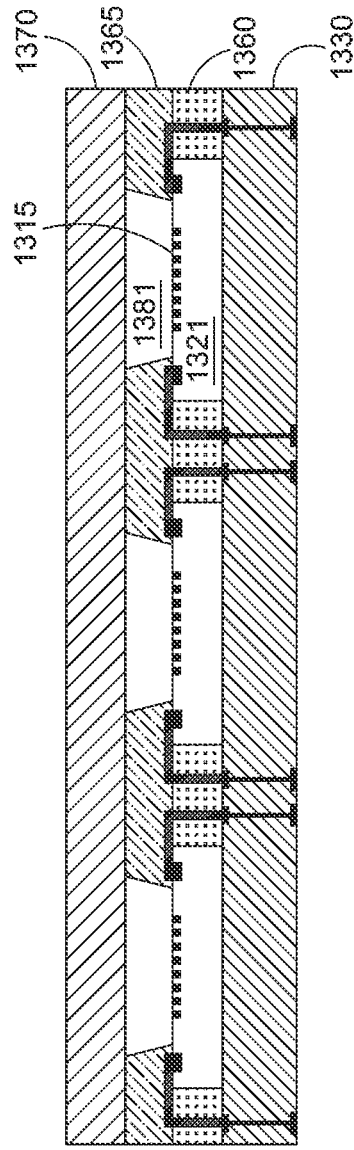
FIG. 18B is a cross-sectional view through dashed line "X" of FIG. 18A following lidding layer attachment, illustrating a fan-out structure in accordance with one or more aspects of the present disclosure.

FIG. 18A is an example of a top view of the structure of FIG. 17, depicting sensors 1321, 1323, and 1325 over substrate 1330. Sensor 1321 includes active surface 1315, sensor bond pads 1326, bond wires 1340, and substrate bond pads 1345, as described above in connection with FIGS. 7-9. FIG. 18B is a cross-sectional view through dashed line "X" of FIG. 18A after placement of a lidding layer 1370 over second molding layer 1365, in accordance with one or more aspects of the present disclosure, to form a flow cell. In one example, lidding layer 1370 is in direct contact with the second molding layer 1365. In another example, lidding layer 1370 and second molding layer 1365 are not in direct contact and are separated by an intermediate layer (e.g., spacer or interposer layer), coating or film. The placement of the lidding layer 1370 may be accomplished using, for example, relatively precise robotic machines (also known as pick-and-place machines), resulting in a gap or space 1381 over the active surface 1315 of the sensor 1321. As such, the second molding layer 1365 serves as a spacer between the lidding layer 1370 and the sensor surface. In one example, the space 1381 over the active surface defines a flow channel 1380 of a flow cell. In one example, the flow channel 1380 encompasses the entire active surface 1315 of sensor 1321 as well as a portion of the inactive surface 1316 of sensor 1321. In one example, the flow channel 1380 encompasses substantially all of the active surface 1315 of the sensor 1321. In another example, the flow channel 1380 encompasses more than about half of the active surface 1315 of the sensor 1321.

Figure 18C:
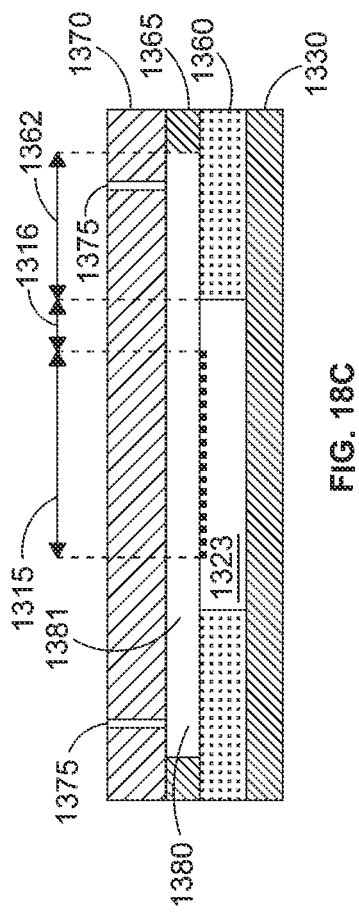
FIG. 18C is a cross-sectional view through dashed line "Y" of FIG. 18A following lidding layer attachment, in accordance with one or more aspects of the present disclosure.

FIG. 18C is a cross-sectional view through dashed line "Y" through sensor 1323 of FIG. 18A after placement of a lidding layer 1370 over second molding layer 1365, in accordance with one or more aspects of the present disclosure, to form a flow cell. Lidding layer 1370 includes inlet and outlet ports 1375 that provide for inflow and outflow of fluids into the flow channel 1380. As shown in the view of FIG. 18C, the flow channel encompasses the entire active surface 1315 of sensor 1323, the entire inactive surface 1316 of sensor 1323, as well as portions of the first molding layer 1360. The horizontal portions of the molding layer 1360 encompassed by the flow channel 1380, i.e., molding layer surface 1362, provides a distance between the inlet/outlet ports 1375 and the active surface of the sensor. Thus, molding layer surface 1362 is between the inlet/outlet ports 1375 and the active surface of the sensor. As such, fluid flowing into the fluid channel 1380 from a port 1375 is able to reach a more uniform flow before reaching the sensor surface of the sensor, which is desirable for the detection of designated reactions and more efficient utilization of the active sensor surface. In one example, the flow channel 1380 encompasses substantially all of the active surface 1315 of the sensor 1323. In another example, the flow channel 1380 encompasses more than about half of the active surface 1315 of the sensor 1323.

Figure 19:
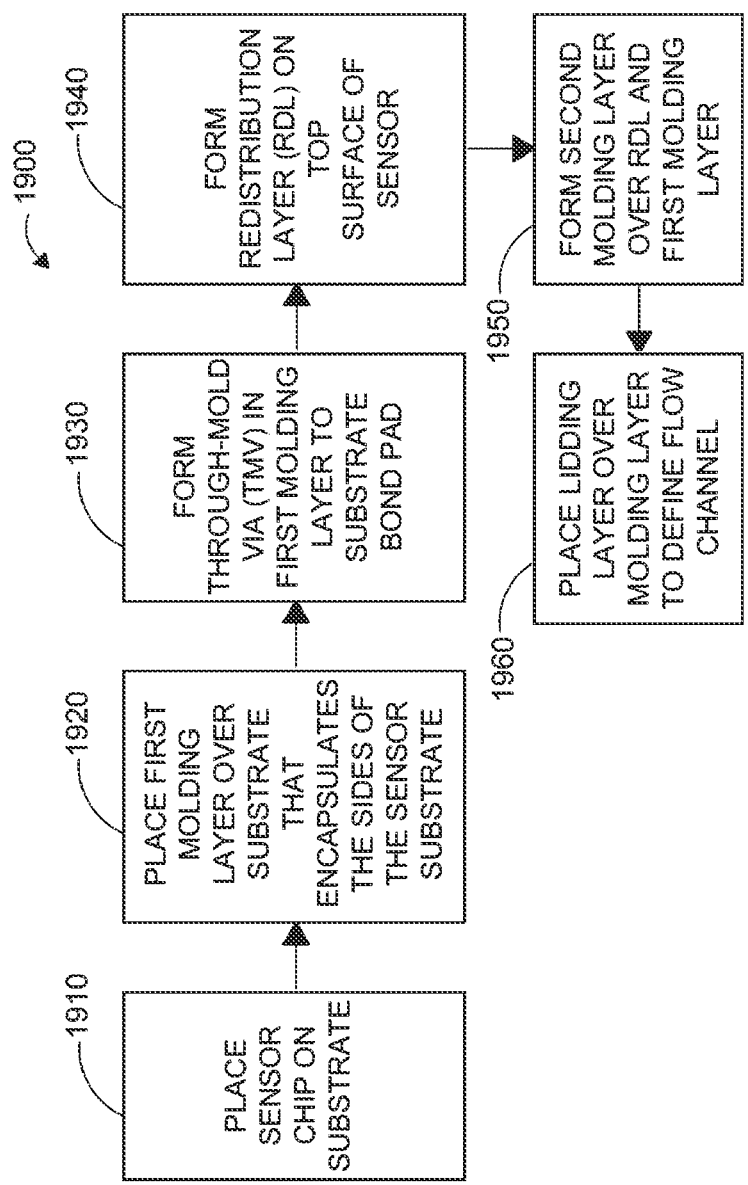
FIG. 19 is a flow diagram of one example of fabricating an apparatus disclosed in FIG. 18B, in accordance with one or more aspects of the present disclosure.

One example of a process 1900 for fabricating the apparatus of the present disclosure as depicted in FIG. 18B will now be described with respect to the flow diagram of FIG. 19. In some examples, sensors are fabricated on a wafer as described above with respect to FIG. 1. As described above in connection with process 600 and 1200, in one example a passivation layer may be provided on the sensor surface to protect the sensor from harmful reaction components and serve as a support surface for wafer level chemistries. Further, wafer level chemistry may be applied to all or a portion of the sensor surface to provide a functionalized coating as described above in connection with process 600 and 1200. At 1910, singulated sensors are attached to the substrate, i.e., picked and placed onto a substrate followed by panelization as described above in connection with FIG. 6. At 1920, a first molding layer is formed over the substrate, and the sides of the sensor, but not over the sensor surface. The molding layer formation may include covering/protecting the sensor surface(s) with, for example, a protective layer (e.g., a mechanical fixture such as a molding pin) that is removed after the molding layer is deposited. By way of example, the molding layer may be deposited in a liquid or solid form and formed using compression molding. The first molding layer is formed to a height that is substantially equal to the height of the sensor surface, which by way of example, can be achieved by planarization.

At 1930, a through-mold via (TMV) is formed through the first molding layer to reach the substrate bond pads on the top side of the substrate. The TMV can be formed by laser drilling or comparable process. The TMV can be filled with a metal, such as tungsten, copper, gold, or nickel. At 1940, a sensor redistribution layer (RDL) is formed on the top side of the sensor to electrically connect the sensor bond pads to the TMV. This can be done by first disposing the sensor RDL over the sensor surface by lithographically patterning and etching the sensor RDL to a predetermined shape. At 1950, a seconding molding layer is deposited. The composition and fabrication of the second molding layer may be similar to that of the first molding layer. The second molding layer is formed to a molding height that is greater than the active surface height to form a space over the sensor to define a flow channel. At 1960, a lidding layer is placed over the second molding layer using, for example, a surface mount process. Alternatively, as described above in connection with FIG. 11, a spacer or interposer layer may be formed over the molding layer and support the lidding layer. Thus, the lidding layer in some examples is not in direct contact with the second molding layer. In one example, following process 1900, the substrate can be diced into individual dies each containing one or more flow cell sensors.

Figure 20:
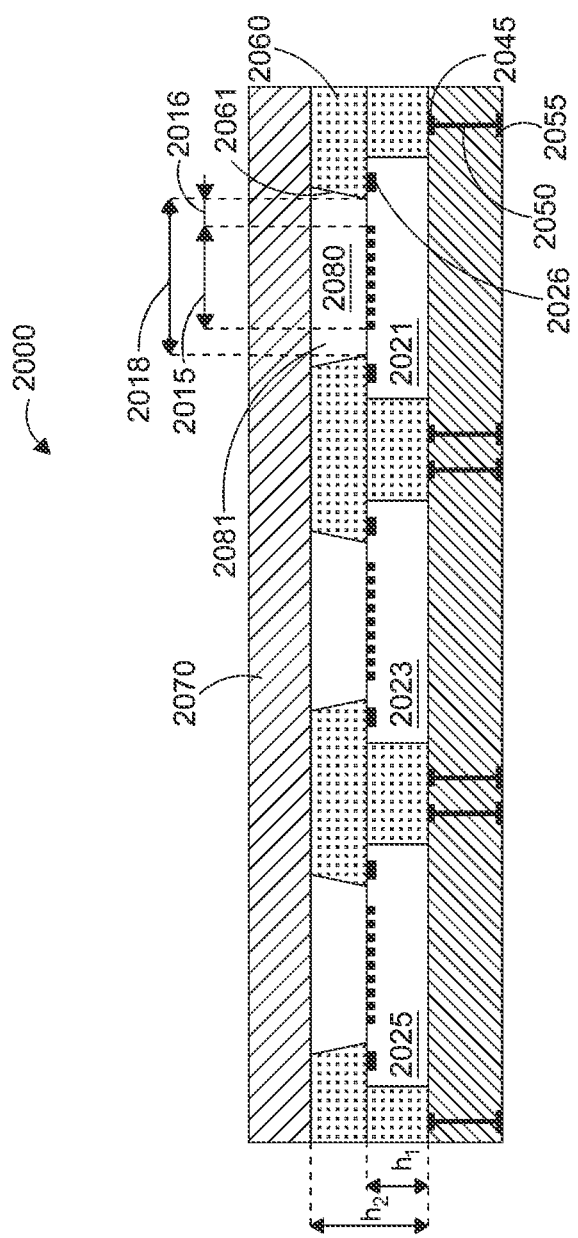
FIG. 20 is a cross-sectional view of one example of forming a molding layer and lidding layer to define a flow channel over the active surface of sensors, illustrating a fan-out structure in accordance with one or more aspects of the present disclosure.

FIG. 20 is a cross-sectional view of one example of a structure 2000 in accordance with one or more aspects of the present disclosure. Sensors 2021, 2023, and 2025 are attached to substrate 2030 as described above. For the following discussion, reference will be made to sensor 2021. By way of example, the structure and composition of substrate 2030 can be as described in connection with substrate 130 of FIG. 2. Sensor 2021 may be attached to the substrate 2030 using, for example, a die-attach adhesive paste or film that may provide, for example, low or ultra-low stress on the sensor and high temperature stability. In one example, the sensor may be directly attached to the substrate, while in other examples a structure, coating or layer may be interposed between the substrate and the sensor. Sensor 2021 includes active surface 2015, inactive surface 2016, and sensor bond pads 2026. In one example, the conductive pathways through substrate 2030 include topside substrate bond pads 2045, electrical vias 2050, and bottom side substrate bond pads 2055. In one example, topside substrate bond pads 2045 are part of a land grid array (LGA) which may comprise a printed circuit board (PCB) or ceramic material. In one example, the substrate 2030 may contain numerous metal layers.

The molding layer 2060 covers the surface of the substrate 2030, including the substrate bond pads 2045. In one example, the molding layer is formed directly on the substrate, while in another example an intermediate structure (e.g., a coating or layer) may be interposed between the molding layer and the substrate. The molding layer also cover the sides of sensor 2021 and sensor bond pad 2026. Molding layer 2060 has openings or apertures 2018 corresponding to the active surfaces of the sensors, e.g., active surface 2015. In the example of FIG. 20, the apertures 2018 encompass the active surface 2015 as well as a portion of the inactive surface 2016. In another example, the apertures 2018 do not encompass (i.e., do not expose) the inactive surface 2016. The portion of the molding layer 2060 over the sensor surface, i.e., molding overhang 2061, may be angled (e.g., at 45 degrees or more) to enable more convenient release of the mold from the sensors during fabrication. In this example, the thickness of the molding overhang 2061 increases moving from the sensor bond pad to the periphery or outer edge of the sensor. However, in another example, the thickness of the molding overhang 2061 may be substantially uniform. The molding layer 2060 is configured to have a top surface that is sufficiently planar to enable a lidding layer 2070 to be placed on top of the molding layer 2060. The molding layer 2060 is formed to a molding height "hi" that is greater than the active surface height "h1." In one example, the molding height is about 40 micrometers to about 200 micrometers greater than the active surface height.

In one example, lidding layer 2070 is in direct contact with the molding layer 2060. In another example, lidding layer 2070 and molding layer 2060 are not in direct contact and are separated by an intermediate layer. The composition and placement of the lidding layer 2070 may be as described above in connection with FIG. 5B. As such, the molding layer 2060 serves as a spacer between the lidding layer 2070 and the sensor surface. In one example, the space 2081 over the active surface defines a flow channel 2080 of a flow cell. In the example shown in FIG. 20, the flow channel 2080 encompasses the entire active surface 2015 of sensor 2021 as well as a portion of the inactive surface 2016 of sensor 2021. In one example, the flow channel 2080 encompasses substantially all of the active surface 2015 of the sensor 2021. In another example, the flow channel 2080 encompasses more than about half of the active surface 2015 of the sensor 2021.

Figure 21:
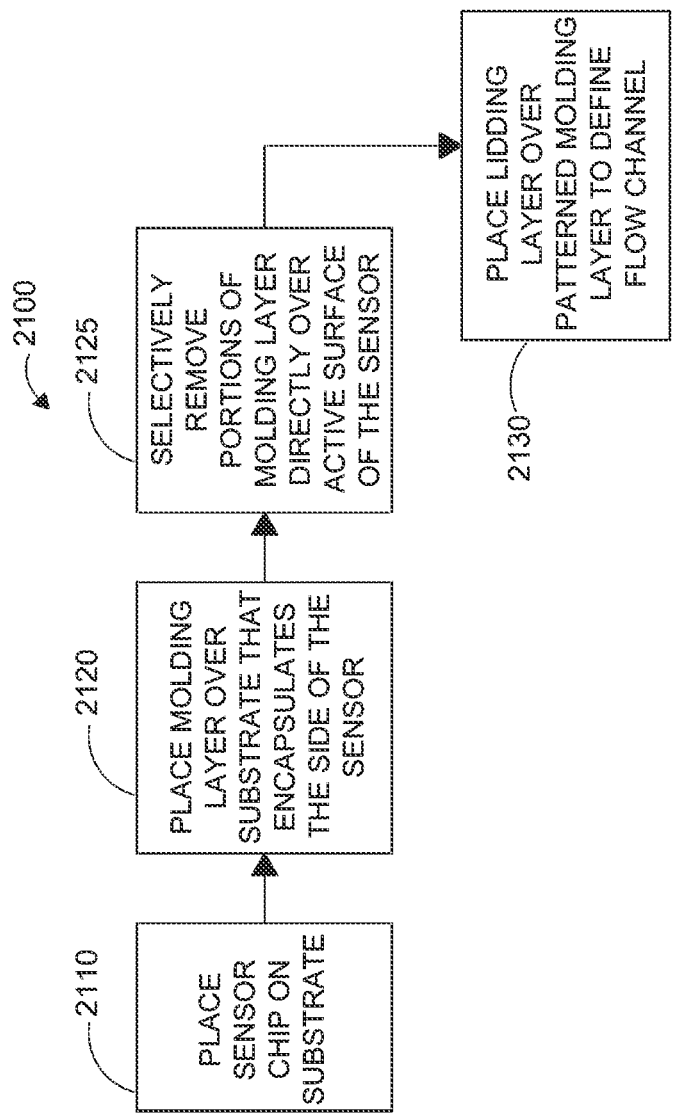
FIG. 21 is a flow diagram of one example of fabricating an apparatus disclosed in FIG. 20, in accordance with one or more aspects of the present disclosure.

One example of a process 2100 for fabricating the apparatus of FIG. 20 in accordance with the present disclosure will now be described with respect to the flow diagram of FIG. 21. At 2110, one or more sensors are placed over a substrate, for example, picked and placed onto a substrate followed by panelization as described above in connection with FIG. 6. At 2120, a molding layer is formed over the substrate, and the sides of the sensor, while leaving an opening or aperture over the sensor surface. The molding layer formation may include covering/protecting the sensor surface(s) with, for example, a protective layer (e.g., a mechanical fixture such as a molding pin) that is removed after the molding layer is deposited. In one example, a molding pin covers/protects the sensor surface(s) while the molding layer is deposited. At 2125, the portions of the molding layer directly over the active sensor surface are selectively removed. The molding layer is formed to a molding height that is greater than the active surface height. Thus, the thickness of the molding layer is controlled to adjust the height of a lidding layer over the sensor surface. By way of example, the molding layer may be deposited in a liquid or solid form and formed using compression molding. At 2130, a lidding layer is placed over the molding layer and the sensor surface using, for example, a surface mount process, to define a flow channel. The "molding layer" over which the lidding layer is placed at this stage refers to the initial molding layer prior to the selective removal. Specifically, the lidding layer in this example may cover the molding layer portions that remain after the selective removal, as well as the space over the sensor surface. Alternatively, as described above in connection with FIG. 11, a spacer or interposer layer may be formed over the molding layer and support the lidding layer. Thus, the lidding layer is not necessarily in direct contact with the molding layer. In one example, following process 2100, the substrate can be diced into individual dies each containing one or more flow cell sensors.

Figure 22:
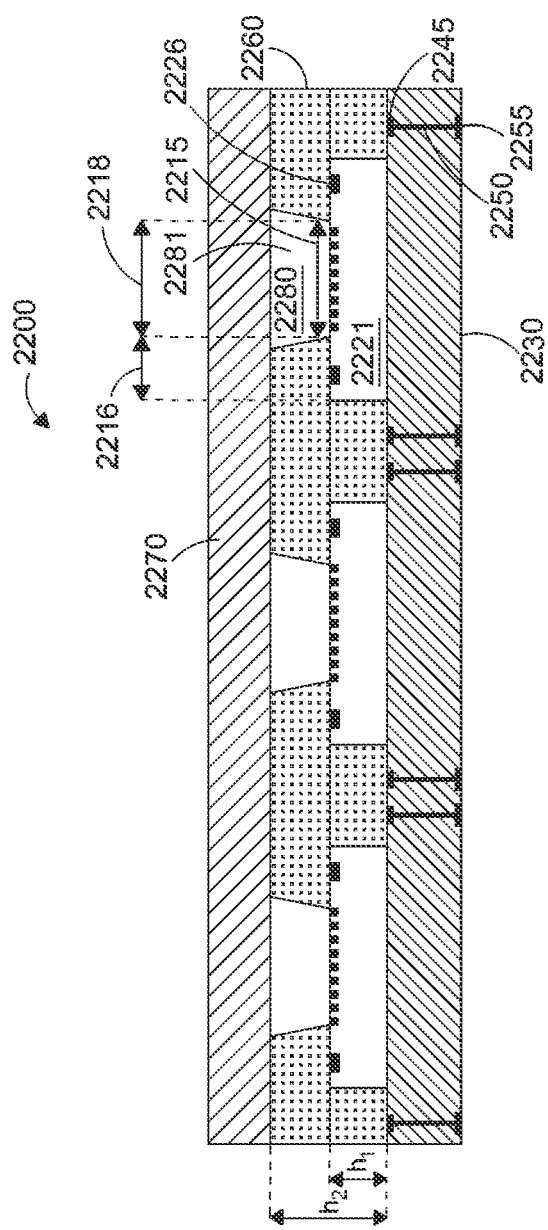
FIG. 22 is a cross-sectional view of one example of forming a molding layer and lidding layer to define a flow channel over the active surface of sensors, illustrating a fan-out structure in accordance with one or more aspects of the present disclosure.

FIG. 22 is a cross-sectional view of one example of a structure 2200 in accordance with one or more aspects of the present disclosure. Sensors 2221, 2223, and 2225 are attached to substrate 2230 as described above. In the example of FIG. 22, the flow channel 2280 encompasses the entire active surface 2215 but encompasses none of the inactive surface 2216. The molding layer covers the surface of substrate 2230, the sides of sensor 2221, inactive surface 2216, sensor bond pads 2226, and substrate bond pads 2245. Thus, the inactive surface 2216 is not encompassed by the space 2281 or flow channel 2280. Furthermore, the apertures 2218 do not encompass (i.e., do not expose) the inactive surface 2216. In one example, the conductive pathways through substrate 2230 include topside substrate bond pads 2045, electrical vias 2250, and bottom side substrate bond pads 2255. In one example, topside substrate bond pads 2245 are part of a land grid array (LGA) which may comprise a printed circuit board (PCB) or ceramic material. In one example, the substrate 2230 may contain numerous metal layers. In one example, the molding layer is formed directly on the substrate, while in another example an intermediate structure (e.g., a coating or layer) may be interposed between the molding layer and the substrate. Molding layer 2260 has openings or apertures 2218 corresponding to the active surfaces of the sensors, e.g., active surface 2215. The molding layer 2260 is configured to have a top surface that is sufficiently planar to enable a lidding layer 2270 to be placed on top of the molding layer 2260. The molding layer 2260 layer is formed to a molding height "h2" that is greater than the active surface height "h1." In one example, the molding height is about 40 micrometers to about 200 micrometers greater than the active surface height. In one example, lidding layer 2270 is in direct contact with the molding layer 2260. In another example, lidding layer 2270 and molding layer 2260 are not in direct contact and are separated by an intermediate layer. The composition and placement of the lidding layer 2270 may be as described above in connection with FIG. 5B.

It is to be understood that the above description is intended to be illustrative, and not restrictive. For example, the above-described examples (and/or aspects thereof) may be used in combination with each other. In addition, many modifications may be made to adapt a particular situation or material to the teachings of the various examples without departing from their scope. While dimensions and types of materials may be described herein, they are intended to define parameters of some of the various examples, and they are by no means limiting to all examples and are merely exemplary. Many other examples will be apparent to those of skill in the art upon reviewing the above description. The scope of the various examples should, therefore, be determined with reference to the appended claims, along with the full scope of equivalents to which such claims are entitled.

In the appended claims, the terms "first," "second," and "third," etc. are used merely as referee labels, and are not intended to impose numerical, structural or other requirements on their objects. Forms of the term "defined" encompass relationships where an element is partially defined as well as relationships where an element is entirely defined. Further, it is to be understood that not necessarily all such objects or advantages described above may be achieved in accordance with any particular example. Thus, for example, those skilled in the art will recognize that the devices, systems and methods described herein may be embodied or carried out in a manner that achieves or optimizes one advantage or group of advantages as taught herein without necessarily achieving other objects or advantages as may be taught or suggested herein.

While the disclosure has been described in detail in connection with only a limited number of examples, it should be readily understood that the disclosure is not limited to such disclosed examples. Rather, this disclosure can be modified to incorporate any number of variations, alterations, substitutions or equivalent arrangements not heretofore described, but which are commensurate with the spirit and scope of the disclosure. Additionally, while various examples have been described, it is to be understood that aspects of the disclosure may include only one example or some of the described examples. Also, while some disclosures are described as having a certain number of elements, it will be understood that the examples can be practiced with less than or greater than the certain number of elements.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

The invention claimed is:

1. A method, comprising:
    placing a sensor over a substrate, the sensor comprising an active surface and a sensor bond pad, wherein the substrate comprises a substrate bond pad;
    placing a molding layer over the substrate that covers sides of the sensor;
    selectively removing portions of the molding layer directly over the active surface of the sensor; and placing a lidding layer over a portion of an upper surface of the molding layer and over the active surface of the sensor to form a space over the active surface of the sensor and over the portion of the upper surface of the molding layer, wherein the space defines a flow channel.

2. The method of claim 1, further comprising wire bonding the sensor bond pad to the substrate bond pad, wherein the molding layer covers the wire bonds.

3. The method of claim 1, further comprising:
forming a through-silicon via (TSV) extending from the sensor bond pad through the sensor, and a redistribution layer (RDL) on a bottom surface of the sensor, wherein the sensor bond pad is electrically connected to the RDL.

4. The method of claim 1, wherein the molding layer is a second molding layer, and the method further comprising forming:
a first molding layer to a height substantially equal to the height of the active surface of the sensor relative to the substrate
a through-mold via (TMV) through the first molding layer to the substrate bond pad,
redistribution layer (RDL) on a top surface of the sensor to electrically connect the sensor bond pad to the TMV, and
the second molding layer over the RDL and first molding layer.

5. The method of claim 1, further comprising forming an inlet port and an outlet port in the lidding layer.

6. The method of claim 1, further comprising forming a passivation layer on the sensor surface.

7. The method of claim 6, further comprising forming reaction recesses in the passivation layer.

8. The method of claim 6, further comprising:
forming a functionalized coating on the passivation layer.

9. A method comprising:
placing a sensor over a substrate, the sensor comprising an active surface and a sensor bond pad, wherein the substrate comprises a substrate bond pad;
placing a molding layer over the substrate that covers sides of the sensor, the molding layer having a molding height extending vertically from a top surface of the substrate, the molding height being greater than a height of the active surface of the sensor, wherein the height of the active surface of the sensor extends vertically from the top surface of the substrate;
selectively removing portions of the molding layer directly over the active surface of the sensor to form an upper surface of the molding layer; and
placing a lidding layer over a portion of the upper surface of the molding layer and over the active surface of the sensor to form a space over the active surface of the sensor and over the portion of the upper surface of the molding layer, wherein the space defines a flow channel.

10. The method of claim 9, further comprising wire bonding the sensor bond pad to the substrate bond pad, wherein the molding layer covers the wire bonds.

11. The method of claim 9, further comprising:
forming a through-silicon via (TSV) extending from the sensor bond pad through the sensor, and a redistribution layer (RDL) on a bottom surface of the sensor, wherein the sensor bond pad is electrically connected to the RDL.

12. The method of claim 9, further comprising forming an inlet port and an outlet port in the lidding layer.

13. The method of claim 9, further comprising forming a passivation layer on the sensor surface.

14. The method of claim 13, further comprising forming reaction recesses in the passivation layer.

15. The method of claim 13, further comprising:
forming a functionalized coating on the passivation layer.

16. A method comprising:
placing a sensor over a substrate, the sensor comprising an active surface and a sensor bond pad, wherein the substrate comprises a substrate bond pad;
placing a molding layer over the substrate that covers sides of the sensor, the molding layer having a molding height extending vertically from a top surface of the substrate, the molding height being greater than a height of the active surface of the sensor, wherein the height of the active surface of the sensor extends vertically from the top surface of the substrate;
selectively removing portions of the molding layer directly over the active surface;
placing an interposer layer over the molding layer; and
placing a lidding layer over the interposer layer and over the active surface of the sensor to form a space over the active surface of the sensor and over a portion of the molding layer, wherein the space defines a flow channel.

17. The method of claim 16, further comprising wire bonding the sensor bond pad to the substrate bond pad, wherein the molding layer covers the wire bonds.

18. The method of claim 16, further comprising:
forming a through-silicon via (TSV) extending from the sensor bond pad through the sensor, and a redistribution layer (RDL) on a bottom surface of the sensor, wherein the sensor bond pad is electrically connected to the RDL.

19. The method of claim 16, further comprising forming an inlet port and an outlet port in the lidding layer.

20. The method of claim 16, further comprising forming a passivation layer on the sensor surface.

* * * * *

UNITED STATES PATENT AND TRADEMARK OFFICE
CERTIFICATE OF CORRECTION

Page 1 of 1

PATENT NO.         : 12,062,674 B2
APPLICATION NO.    : 17/804023
DATED              : August 13, 2024
INVENTOR(S)        : Emadi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 49 days.

Signed and Sealed this
Sixth Day of May, 2025

Coke Morgan Stewart
*Acting Director of the United States Patent and Trademark Office*